United States Patent [19]
Benjamin et al.

[11] Patent Number: 6,087,778
[45] Date of Patent: Jul. 11, 2000

[54] SCALABLE HELICON WAVE PLASMA PROCESSING DEVICE WITH A NON-CYLINDRICAL SOURCE CHAMBER HAVING A SERPENTINE ANTENNA

[75] Inventors: Neil Benjamin, East Palo Alto; Stefano Mangano, Menlo Park, both of Calif.; Russell Jewett, Newark, Calif.

[73] Assignee: Lam Research Corporation, Fremont, Calif.

[21] Appl. No.: 08/981,252

[22] PCT Filed: Jun. 28, 1996

[86] PCT No.: PCT/US96/11157

§ 371 Date: May 11, 1998

§ 102(e) Date: May 11, 1998

[87] PCT Pub. No.: WO97/01655

PCT Pub. Date: Jan. 16, 1997

[51] Int. Cl.[7] ...................................................... H05H 1/46
[52] U.S. Cl. .................. 315/111.51; 343/731; 118/723 I; 118/723 IR; 118/723 AN
[58] Field of Search ......................... 315/111.21, 111.41, 315/111.51; 118/723 MW, 723 I, 723 JR, 723 AN; 343/731, 732, 792.5, 806

[56] References Cited

U.S. PATENT DOCUMENTS

| | | | |
|---|---|---|---|
| 3,596,271 | 7/1971 | Coslett et al. | 343/731 |
| 3,716,861 | 2/1973 | Root | 343/806 X |
| 3,814,983 | 6/1974 | Weissfloch et al. | 315/111.21 X |
| 4,521,717 | 6/1985 | Kieser | 315/111.21 X |
| 5,122,251 | 6/1992 | Campbell et al. | 204/298.06 |
| 5,261,962 | 11/1993 | Hamamoto et al. | 118/723 I |
| 5,326,725 | 7/1994 | Sherstinsky et al. | 118/728 X |
| 5,686,796 | 11/1997 | Boswell et al. | 315/111.51 |

FOREIGN PATENT DOCUMENTS

| | | | |
|---|---|---|---|
| 553704 | 8/1993 | European Pat. Off. | 315/111.51 |
| 4019921 | 9/1994 | European Pat. Off. | 315/111.41 |
| 0 628 644 | 12/1994 | European Pat. Off. | |
| 0 668 607 | 8/1995 | European Pat. Off. | |
| 1118280 | 11/1961 | Germany | 343/806 |
| 2142783 | 6/1987 | Japan | 118/723 MW |
| 4144992 | 5/1992 | Japan | 118/723 MW |
| 4304630 | 10/1992 | Japan | 315/111.41 |

*Primary Examiner*—Benny T. Lee
*Attorney, Agent, or Firm*—Burns, Doane, Swecker & Mathis, L.L.P.

[57] ABSTRACT

A plasma processing device (25) including a vacuum chamber (27) for processing a substrate (29) and a source chamber (26) for generating a plasma is disclosed where the source chamber (26) has a non-cylindrical geometry. Helicon waves of plasma are propagated from the source chamber into the vacuum chamber by a magnetic field having substantially parallel magnetic field lines extending from the source chamber into the vacuum chamber. A RF antenna (31 and 32) of a novel serpentine configuration is used to couple electromagnetic energy into the source chamber to create helicon plasma waves in the source chamber (26). The non-cylindrical geometry of the source chamber allows the processing of large area substrates due to the ability to scale the source chamber to the desired application while maintaining throughput efficiency and the ability to propagate helicon waves along the magnetic field lines present in the source chamber. In one embodiment a linear source chamber having the shape of an elongated rectangular box is disclosed wherein a slot opening (28) connects the source chamber to the vacuum chamber. Due to the ability of the helicon waves from a linear source chamber to propagate in a vacuum chamber without interference from a helicon wave from a similar source chamber, a plasma processing device is disclosed wherein multiple extended non-cylindrical source chambers are arranged to propagate nonparallel helicon plasma waves in a vacuum chamber.

16 Claims, 14 Drawing Sheets

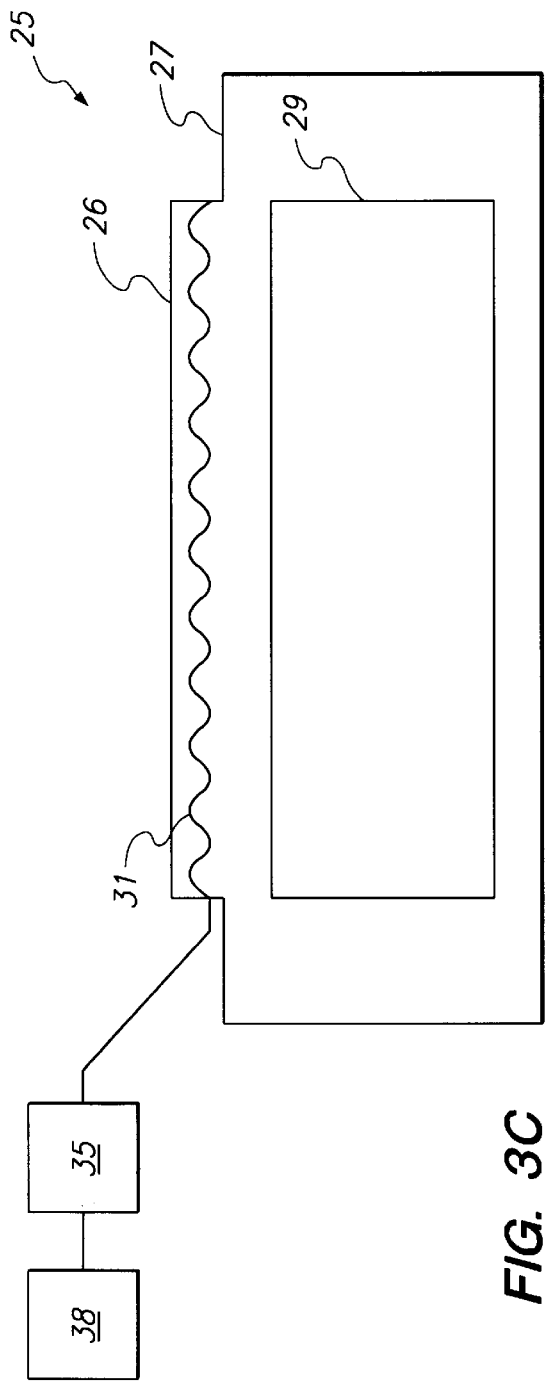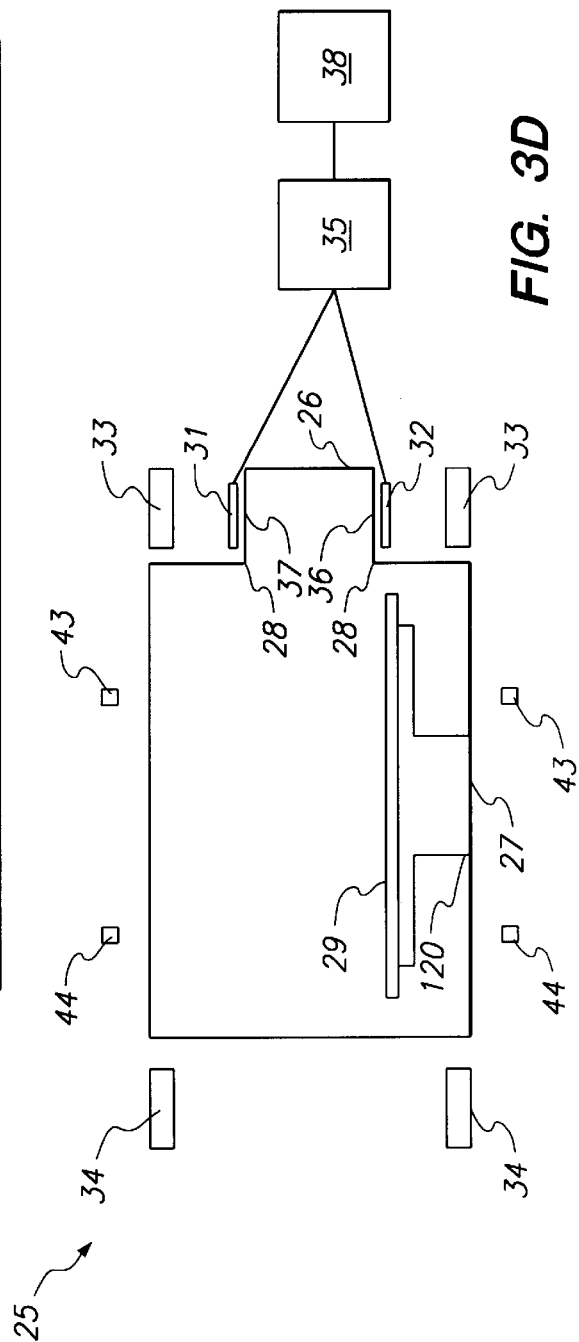

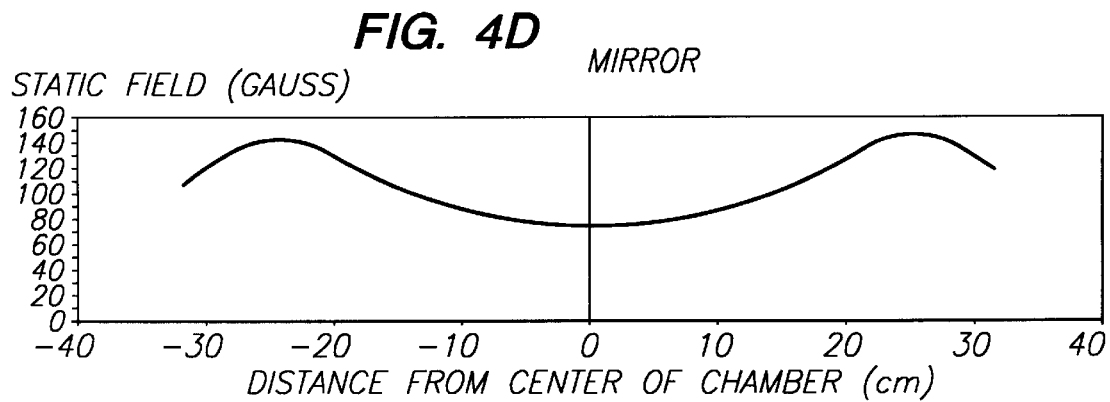
FIG. 4D MIRROR
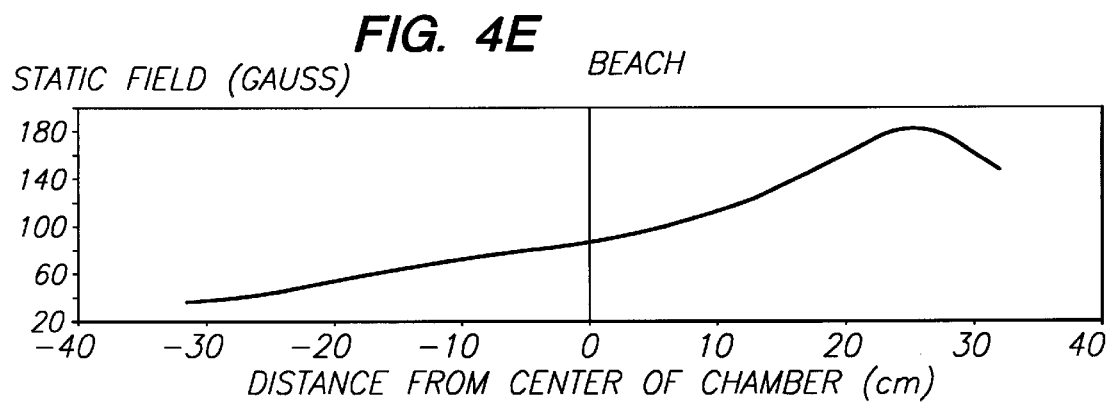
FIG. 4E BEACH
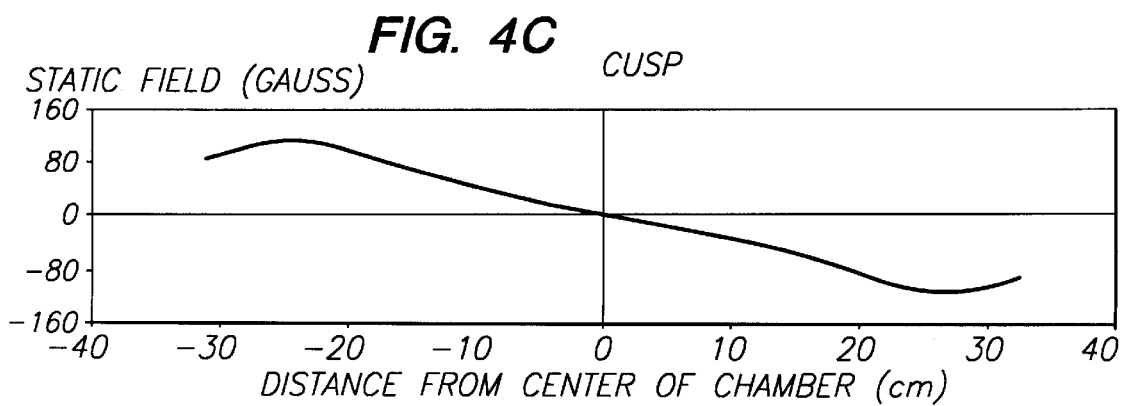
FIG. 4C CUSP

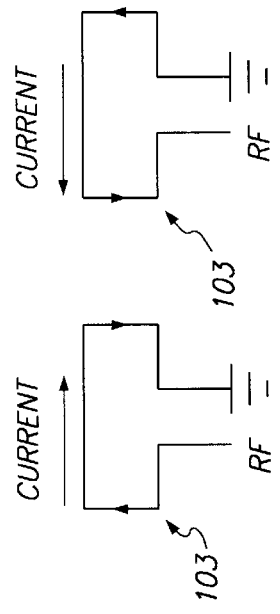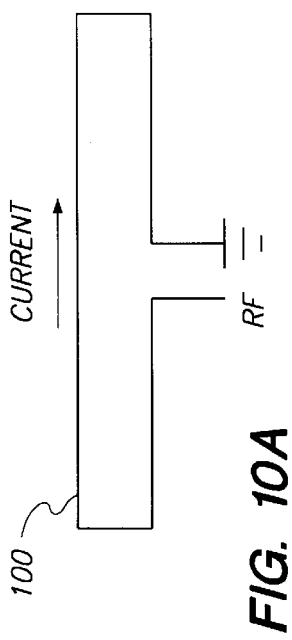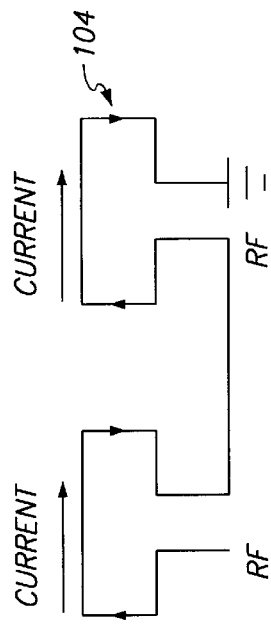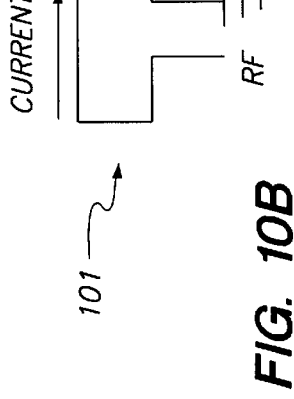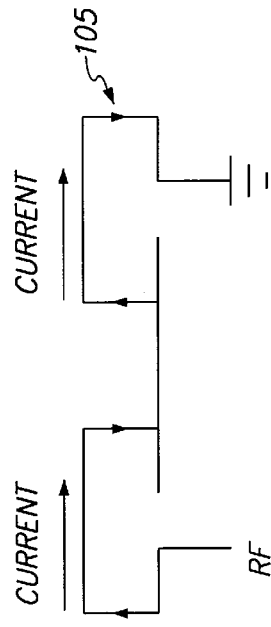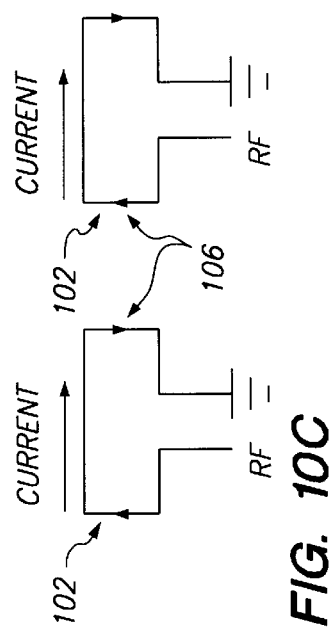

SCALABLE HELICON WAVE PLASMA PROCESSING DEVICE WITH A NON-CYLINDRICAL SOURCE CHAMBER HAVING A SERPENTINE ANTENNA

FIELD OF THE INVENTION

The present invention relates in general to the field of plasma processing devices which are used in depositing and etching layers on a substrate. More particularly, the present invention relates to a helicon plasma wave source for use in processing semiconductor wafers and other substrates.

BACKGROUND OF THE INVENTION

Plasmas have gained a wide acceptance in materials processing with their application to etching and depositing layers on the surface of a substrate. More particularly, plasma sources are used in processing semiconductor wafers for use in the manufacture of semiconductor devices such as integrated circuit devices. Plasma sources have also been used in other material processing such as in the coating of flat panel displays. The basic properties required of a plasma for most processing applications are high density, low plasma potential, high uniformity of plasma, and operation over a wide pressure range. A low pressure, high density plasma is superior at etching and depositing layers on the fine scale that microelectronic and other applications require. Additionally, to produce consistent results over the area of the substrate being processed the plasma must have a uniform density over the area of the substrate being processed.

Greater efficiency in processing substrates can be achieved by increasing the area on a substrate capable of being processed. To reduce the cost of production a plasma processing device would ideally be able to process as large a substrate as possible. Thus, an essential feature of any successful plasma processing device is the ability to scale up the source chamber to be able to efficiently process larger areas of a substrate.

It is well known in the art that a plasma can be generated in a low pressure gas, such as argon or $SF_6$, by exciting helicon waves with the use of a radio frequency (hereinafter RF) antenna. Helicon wave plasma etching has advantages over conventional parallel plate, ECR (electron cyclotron resonance) or RFI (radio frequency inductive) plasma systems. For instance helicon wave plasma etching requires a lower magnetic field than ECR and helicon discharges have a lower plasma potential than parallel plate etching. To excite helicon waves in an ionized gas within the source chamber energy from the RF antenna is coupled into plasma to produce the helicon waves. A helicon wave is an electromagnetic wave which, in a source chamber with a cylindrical geometry, will propagate along the magnetic field lines of a magnetic field in the source chamber. A source chamber with cylindrical geometry allows the propagation of both right- and left-hand polarized helicon waves. Conventional cylindrical geometry source chambers therefore allow the propagation of helicon waves and the resulting plasma out of the source chamber and into a vacuum chamber for processing a substrate. This was the geometry used by Boswell in U.S. Pat. No. 4,810,935, the subject matter thereof being incorporated by reference.

While cylindrical geometry source chambers are capable of producing a uniform, high density, low pressure plasma which can be propagated along magnetic field lines into a vacuum chamber by helicon waves, the conditions that allow helicon wave propagation, specifically cylindrical geometry, pose significant limitations on the scaling up of the source chamber to allow the processing of larger area substrates. Since helicon plasma waves characteristically produce high density, low pressure plasmas ideal for processing substrates it is advantageous for any source chamber geometry to be able to use helicon waves to create and propagate the plasma from the source chamber to the substrate. Considerable research in the area of antenna design has led to significant improvements in the area, density and uniformity of plasma generated with cylindrical geometry source chambers. Despite these improvements, significant limitations remain that make scaling up a cylindrical geometry helicon wave plasma source chamber impractical. Accordingly, there is a need in the art for a plasma processing device with a scalable plasma source chamber capable of producing a uniform, high density, low pressure plasma which can be propagated from the source chamber into a vacuum chamber for processing a substrate.

SUMMARY OF THE INVENTION

According to the present invention, a plasma processing device with a source chamber having a non-cylindrical geometry is provided which produces a high density low pressure plasma over an extended area. Unlike prior art cylindrical geometry source chambers the present invention has the advantage of being scalable, i.e., the length of the source chamber can be scaled to process larger substrates without decreasing the uniformity of the plasma or compromising the high density low pressure nature of the plasma produced by a linear source chamber. Additionally, scaling the non-cylindrical source chamber of the present invention allows scaling the process area of the source chamber without requiring a disproportionate increase in the energy needed to create a plasma within the source chamber.

To produce plasma in the linear source chamber, an RF antenna is used to excite helicon waves in the gas within the linear source chamber. The energy from the RF antenna is coupled to the plasma in the linear source chamber. Magnets placed outside the linear source chamber and vacuum chamber produce a magnetic field having magnetic field lines extending from the linear source chamber into the vacuum chamber. Helicon plasma waves, which propagate along magnetic field lines, propagate from the linear source chamber into the vacuum chamber and can effect a desired process reaction with the substrate.

In one embodiment of the present invention, the non-cylindrical source chamber has a linear geometry wherein the source chamber has the shape of an extended rectangular box and is connected to a vacuum chamber. This linear source chamber is connected to a vacuum chamber by a thin elongated slot opening, the slot opening being parallel to the long dimension of the linear source chamber.

In another embodiment of the present invention, a plurality of linear source chambers are used. For example, two linear source chambers can be arranged such that helicon plasma waves propagating from each of the linear source chambers propagate in parallel or nonparallel directions within the vacuum chamber.

Another aspect of the present invention is the unique geometry of the RF antenna used to create helicon plasma waves in the source chamber. In one embodiment of the present invention a serpentine antenna is used which is particularly adaptable to exciting helicon plasma waves in a linear source chamber. The serpentine configuration creates alternating magnetic fields which set up "push-pull regions", thereby efficiently coupling the electromagnetic energy of the RF antenna into the gas of the source chamber to create helicon plasma waves. In another embodiment of the present invention a multiple loop RF antenna is used. The multiple loops of the RF antenna are arranged such that when powered in parallel by an RF generator the current in neighboring loops flows in opposite directions, thereby inducing oppositely directed magnetic fields to create push/pull regions within the source chamber to excite helicon plasma waves.

BRIEF DESCRIPTION OF THE DRAWINGS

FIGS. 3C–3E show cross sectional views of plasma processing devices in accordance with the invention wherein FIG. 3C shows a top cross sectional view wherein a linear source chamber is on one side of a vacuum chamber, FIG. 3D shows an end cross sectional view of the arrangement shown in FIG. 3C, and FIG. 3E shows a side sectional view wherein an antenna is located outside the plasma processing device adjacent to a dielectric window in a sidewall of the plasma processing device;

FIG. 4C is a graph of magnetic field strength versus position within a source and vacuum chamber for a cusp magnetic field geometry in accordance with the present invention;

FIG. 4D is a graph of magnetic field strength versus position within a source and vacuum chamber for a mirror magnetic field geometry in accordance with the present invention;

FIG. 4E is a graph of magnetic field strength versus position within a source and vacuum chamber for a beach magnetic field geometry in accordance with the present invention;

FIGS. 10A–10F show several embodiments of the RF antenna designs in accordance with the present invention wherein FIG. 10A shows a large loop antenna, FIG. 10B shows a small loop antenna, FIG. 10C shows a pair of small antenna loops powered in the same direction, FIG. 10D shows a pair of loop antennas powered in opposite directions, FIG. 10E shows an antenna configuration wherein parallel sections provide oppositely directed current to create push/pull regions which excite helicon waves, and FIG. 10F shows a modified version of the antenna of FIG. 10E;

DETAILED DESCRIPTION OF THE PREFERRED EMBODIMENTS

Figure 1B:
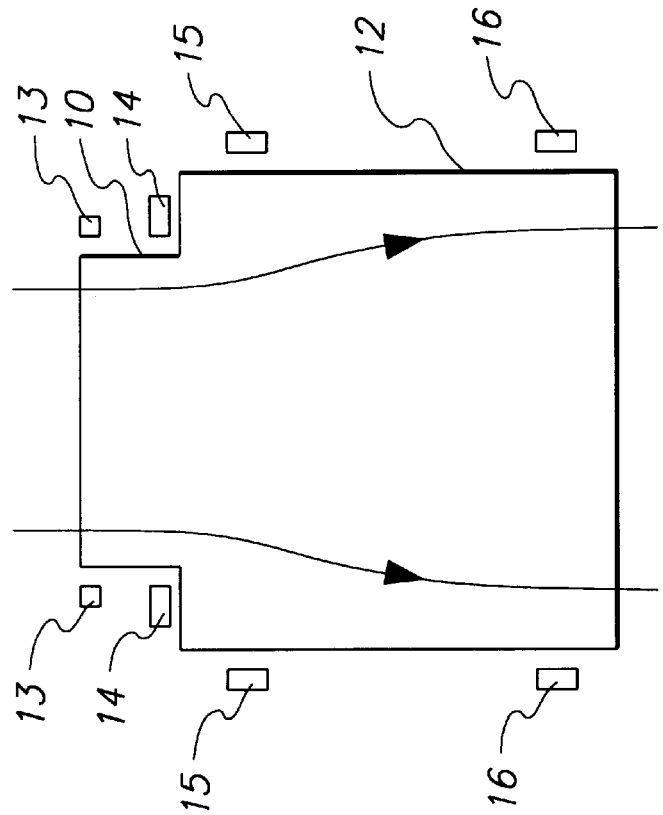
FIGS. 1A and 1B show a cylindrical source chamber and a vacuum chamber of the prior art for processing a substrate with a helicon plasma source chamber.
Figure 1A:
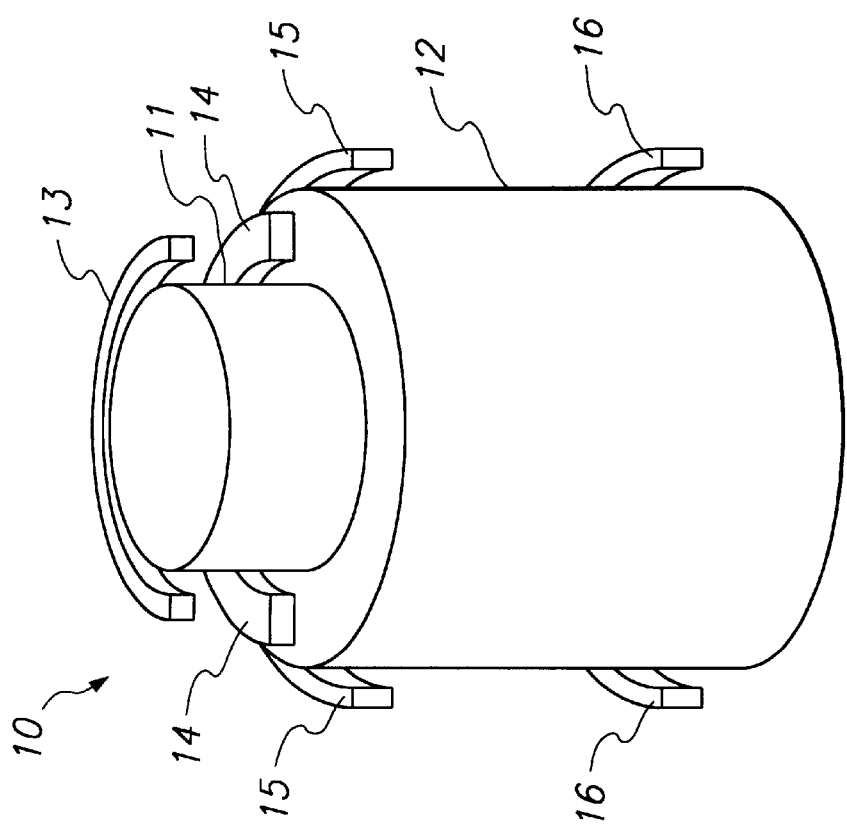

FIGS. 1A and 1B show a prior art device 10 with a source chamber 11 having a cylindrical geometry and a diameter of 10–20 cm. A cylindrical geometry source chamber with a process area of 190 $cm^2$ is large enough to process a 6 inch diameter silicon wafer. In a cylindrical geometry source chamber, the dispersion relation allows helicon waves to propagate along the magnetic field lines of a magnetic field in the source chamber. By inducing in the source chamber a magnetic field having parallel magnetic field lines which extend from the source chamber into the vacuum chamber 12, the helicon plasma waves within the source chamber will propagate along the magnetic field lines into the vacuum chamber. The magnets 13, 14, 15 and 16 produce a magnetic field within the source chamber 10 with magnetic field lines that are substantially parallel and extend from the source chamber to the vacuum chamber 12, as shown in FIG. 1B. The magnetic field lines within the vacuum chamber are not parallel and have a cusp geometry. As a cylindrical geometry source chamber is scaled up to larger diameters, the total volume of the source chamber scales to the 3/2 power of the process area of the source chamber. Thus, to increase the process area of a cylindrical geometry source chamber by a factor of 4 the total volume is increased by a factor of 8. Scaling a cylindrical geometry source chamber to increase the process area is impractical due to the significant increase in energy required to produce a plasma in a large cylindrical geometry source chamber.

As cylindrical geometry source chambers have inherent limitations in their ability to be scaled up to process larger areas of substrates, the present invention, by departing from the cylindrical geometry, allows not only helicon wave propagation but propagation of any type of elliptical wave, of which helicon waves are a subset.

Previous designs of source chambers in material processing equipment utilized cylindrical geometry source chambers due to their exclusive ability to propagate helicon waves. Non-cylindrical geometries of source chambers are not found in the prior art. By realizing that non-cylindrical geometry source chambers can propagate not only helicon waves but elliptical waves, the present invention is able to produce a non-cylindrical helicon wave plasma source chamber capable of scaling its processing area without disproportionate increases in the energy required to produce a plasma within the non-cylindrical source chamber. More particularly, by solving the following provided linearized Maxwell equations, Eqn. 1, 2, 3 and 4, along with Eqn. 5 and 6, assuming a perturbation of exp[i(nx+my+kz−wt)] where i is the square root of −1, x,y,z are the three dimensional components of the volume within the source chamber, t is time, and using the boundary conditions of a rectangular geometry where the perturbed current and thus the perturbed magnetic field must go to 0, then the dispersion relation shows that helicon waves can propagate. The linearized Maxwell equations, and Eqn. 5 and 6, are given by:

$$\nabla x E = -\frac{\partial B}{\partial t} \quad (1)$$

$$\nabla x B = \mu_o j \quad (2)$$

$$E = jx \frac{B_o}{q_e n_o} \quad (3)$$

$$\nabla \cdot B = 0 \quad (4)$$

$$\nabla \cdot j = 0 \quad (5)$$

$$j_\perp = q_e n_o \frac{E x B_o}{B_o^2} \quad (6)$$

In Eqn. 1–6, $n_o$ is the equilibrium density of the gas, $B_o$ the equilibrium magnetic field, n is the perturbed density, B the magnetic field, E the electric field, $\mu_o$ is a permeability constant, $q_e$ is an electrical charge, and j the current. Solutions to the equations 1–6 do not have to be in the form of a cylindrical geometry for the dispersion relation to allow the propagation of helicon waves. More particularly, by varying the shape and size of the source chamber, in addition to the size and shape of the opening between the source chamber and the vacuum chamber, a solution can be obtained allowing helicon wave propagation for many non-cylindrical geometries, in contrast to the prior art. The present invention takes advantage of this new realization and is able to create source chambers in rectangular and other non-cylindrical geometries.

As an example, a solution to equations 1–6 for a rectangular geometry is accomplished by introducing the functions X(x) and Y(y) as general solutions to the wave equation in x and y. The wave equation, which is derived from equations 1–6 and assuming the perturbation above, is given by:

$$\nabla^2 B + \alpha^2 B = 0 \quad (7)$$

The z component of the perturbed magnetic field is assumed to be a function of the components in the x an y directions. That is, $B_z = X(x)Y(y)$. By substituting into Eqn. 7, the following relation is obtained $$(\alpha^2 - k^2)XY + Y\frac{\partial^2 X}{\partial x^2} + X\frac{\partial^2 Y}{\partial y^2} = 0 \quad (8)$$

Separating variables, and setting the X and Y part equal to a constant b, independent equations are obtained for each. They are given in equations 9 and 10.

$$\frac{\partial^2 Y}{\partial y^2} + b^2 Y = 0 \quad (9)$$

$$\frac{\partial^2 X}{\partial x^2} + (\alpha^2 - k^2 - b^2)X = 0 \quad (10)$$

For finite solutions, both equations 9 and 10 have solutions of sums of sine and cosine functions. Assuming the boundary conditions stated above for a rectangular geometry both sine and cosine solutions exist for Y(y) with the constant b having multiples of nπ/L, where L is the width of the source chamber in the y direction with the appropriate antenna design and for the proper size source chamber. Thus, depending upon source chamber dimensions, a properly constructed RF antenna is capable of inducing the propagation of helicon waves in a rectangular geometry source chamber having a static magnetic field within the source chamber.

While the linearized Maxwell equations 1–4 and equations 5 and 6 were solved above for a rectangular geometry source chamber the present invention is applicable to any non-cylindrical geometry source chamber. The above solution for a rectangular geometry source chamber is used only as an example. Solutions for other non-cylindrical source chambers can be attained by the general method shown above and assuming the boundary condition appropriate for the chosen geometry.

An essential feature of the solutions to equations 9 and 10 is that having assumed that $B_z = X(x)Y(y)$ and found that equations 9 an 10 had solutions in the form of a sum of sine and cosine functions there is no z component in the solution to the wave equation 7. Thus, the source chamber may be scaled in the z direction for any solution to the wave equation. In other words, the height and width of the chamber are the critical dimensions to allow helicon wave formation and once x and y are properly chosen any value of z is allowable.

While the present invention allows any type of non-cylindrical geometry to be used for source chamber, rectangular geometries, as discussed in greater detail below, have the additional advantage of allowing process area scaling without a disproportionate increase in the energy needed to create a plasma within the source chamber.

Figure 2:
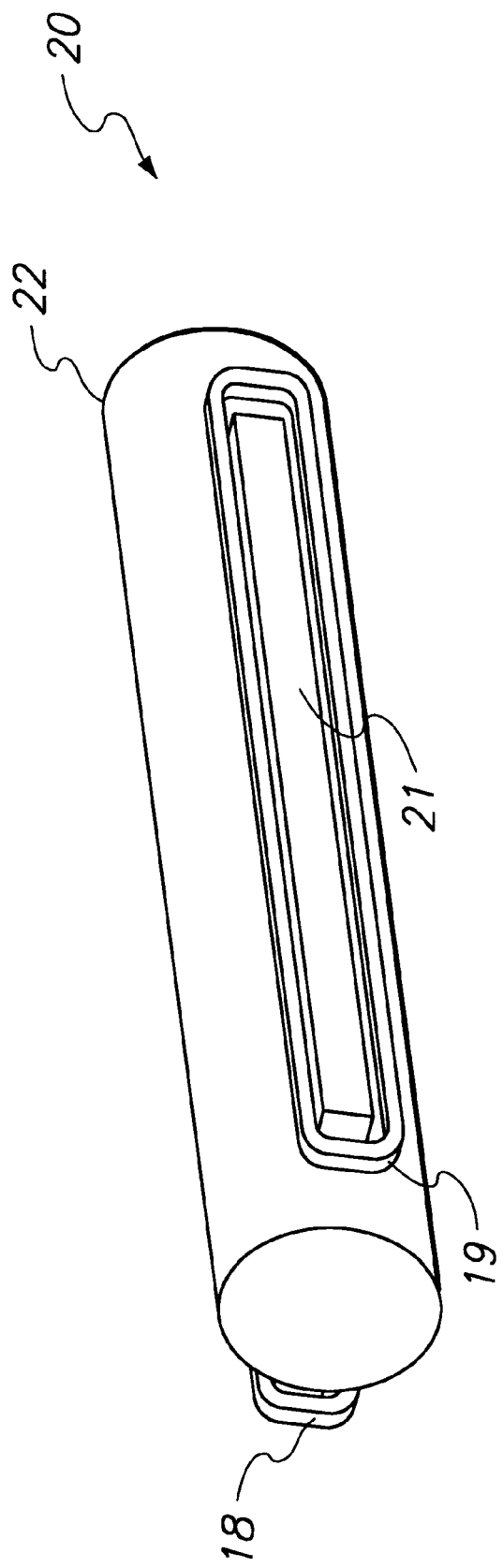
FIG. 2 shows a perspective view of a linear source chamber and a vacuum chamber in accordance with the present invention.

FIG. 2 is a perspective view of a plasma processing device 20 according to the present invention. A linear source chamber 21, having the shape of a long thin rectangular box, is connected to a vacuum chamber 22. The linear source chamber 21 is connected to the vacuum chamber 22 such that the long side of the linear source chamber 21 faces the vacuum chamber 22. The shape of the vacuum chamber 22 in this embodiment is rectangular but the vacuum chamber can have any desired configuration such as cylindrical. A pair of magnets 18 and 19 produce a magnetic field within the source chamber 21 and vacuum chamber 22.

Figure 3A:
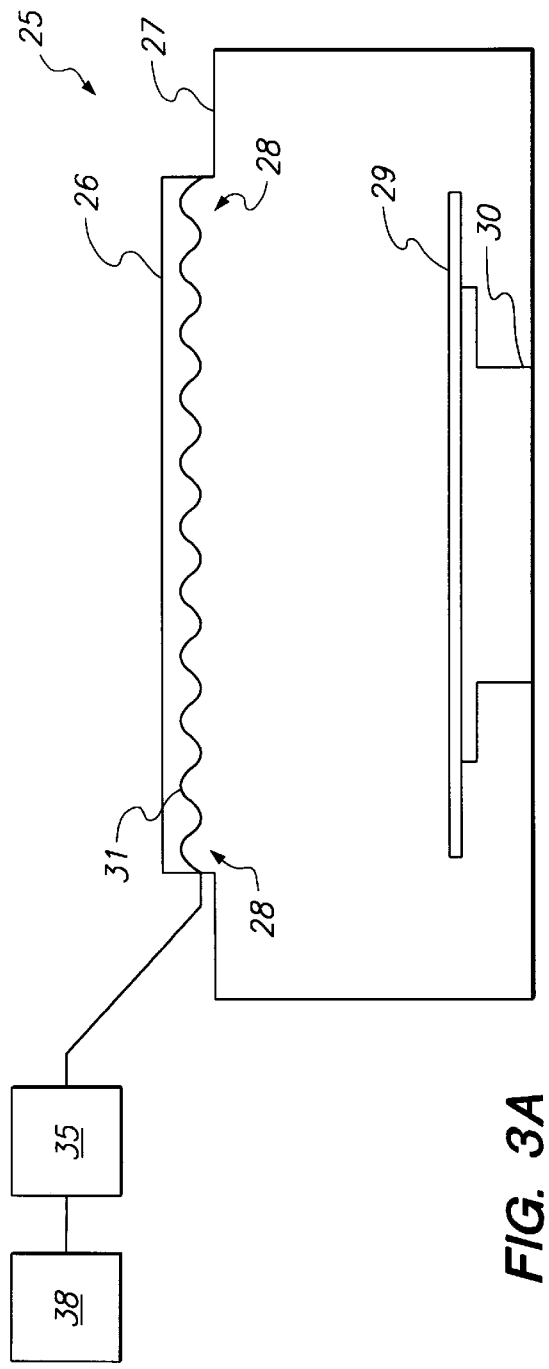
FIG. 3A shows a cross sectional view of a plasma processing device with a linear source chamber in accordance with the present invention.
Figure 3B:
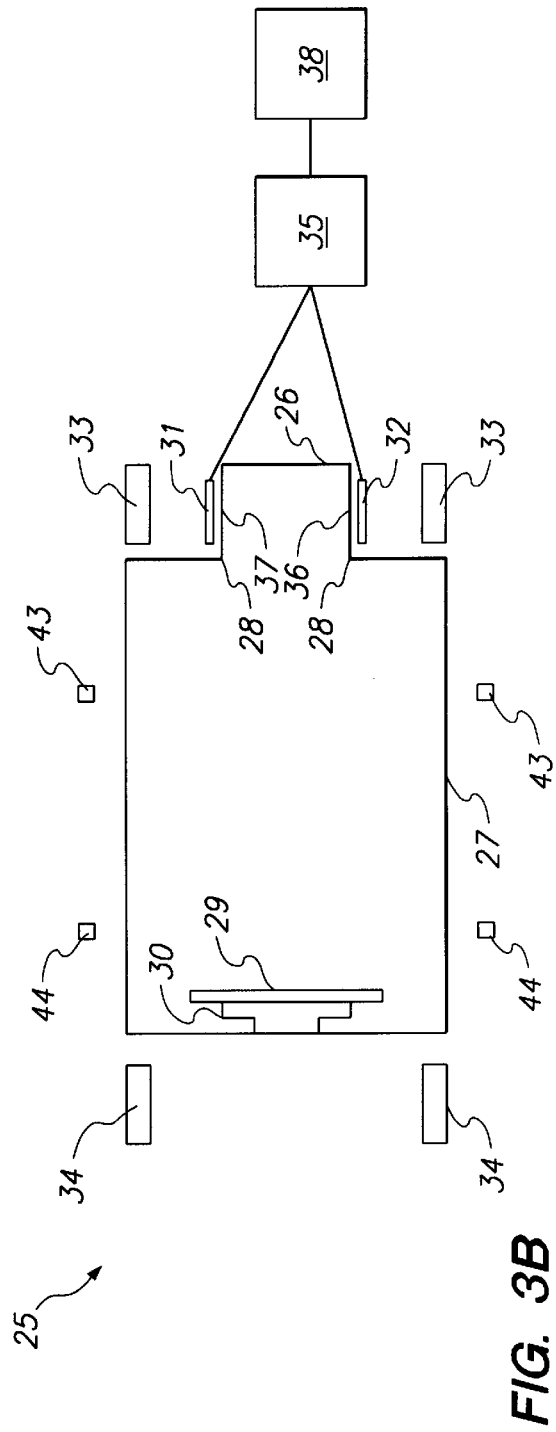
FIG. 3B shows a cross sectional end view of the plasma processing device shown in FIG. 3A.

FIG. 3A shows a cross sectional view of a plasma processing device 25 with a linear source chamber 26 and a vacuum chamber 27. FIG. 3B shows a second cross sectional view of the plasma processing deceive 25 shown in FIG. 3A. The linear source chamber 26 is in the shape of a long rectangular box and is connected to the vacuum chamber 27 along the long side of the linear source chamber. As an example, the linear source chamber 26 is 900 mm long by 90 mm wide by 90 mm deep. An opening 28 between the linear source chamber 26 and vacuum chamber 27 allows helicon plasma waves to propagate from the source chamber into the vacuum chamber. The opening 28 is non-circular in the shape of a long rectangular slot in a wall separating the linear source chamber from the vacuum chamber. The long slot is parallel to the long dimension of the linear source chamber and dimensions of the slot are 900 mm by 90 mm. Thus, plasma waves generated along the entire length of the linear source chamber 26 can propagate through the slot opening 28 into the vacuum chamber 27. A substrate 29 which is to be processed is placed on workpiece holder 30 within the vacuum chamber 27. The source chamber 26 and vacuum chamber 27 are filled with a gas such as argon or $CF_4$ at a pressure in the range of 1 to 50 mTorr. A standard vacuum pump can be utilized to evacuate air from the source and vacuum chambers and a simple valve is opened to allow the flow of the intended gas, be it argon, $CF_4$ or another gas, into the source and vacuum chambers from a gas bottle. A pressure regulator valve allows control of the pressure of the gas flowing from the bottle such that the pressure flow of the gas is stopped when the pressure in the source and vacuum chambers reaches the desired result.

A pair of RF antennas 31 and 32 (see FIG. 3B) are located on either side of the linear source chamber 26 along its lengthwise direction and extend along the length of the linear source chamber 26. The purpose of the RF antennas 31 and 32 is to excite helicon waves within an ionized gas in the linear source chamber 26. In this embodiment, the RF antennas 31 and 32 have a serpentine configuration (best seen in FIG. 3A) which produce a uniform plasma along the length of the linear source chamber 26. The best results can be obtained with two opposed RF antennas 31 and 32 located on opposite sides of the linear source chamber 26. However, the use of one RF antenna located on just one side of the linear source chamber 26 can also create a high density, low pressure plasma over the entire length of the linear source chamber 26. The RF antennas 31 and 32 are powered by a standard RF generator 38 and controlled by an RF matching network 35. The specific configuration of the RF antennas 31 and 32 is discussed in greater detail below.

The RF antenna 31 is located adjacent to the top wall 37 near the connection between the linear source chamber 26 and vacuum chamber 27. Similarly, the RF antenna 32 is located adjacent to the bottom wall 36 near the connection between the linear source chamber 26 and vacuum chamber 27. The top wall 37 and bottom wall 36 of the source chamber 26 are both made from a dielectric material. This allows the energy from the RF antennas 31 and 32 to more efficiently couple to the plasma within the linear source chamber 26. Quartz, glass and ceramic materials are all suitable dielectric materials for use in the top wall 37 and bottom wall 36. The other walls of the source chamber can be made from either a dielectric material or a metal. The walls of the vacuum chamber 27 can be made of any suitable material such as metal. While the embodiment of the present invention shown in FIGS. 3A and 3B uses two RF antennas 31 and 32, another possible embodiment uses only one RF antenna located along a dielectric wall of the source chamber 26 to excite the plasma within the source chamber 26 to form helicon waves. While the use of two RF antennas 31 and 32 provides the most efficient and uniform creation of helicon plasma waves within the source chamber 26, the use of only one RF antenna to create helicon plasma waves within the source chamber 26 provides a less complex arrangement.

Figure 3E:
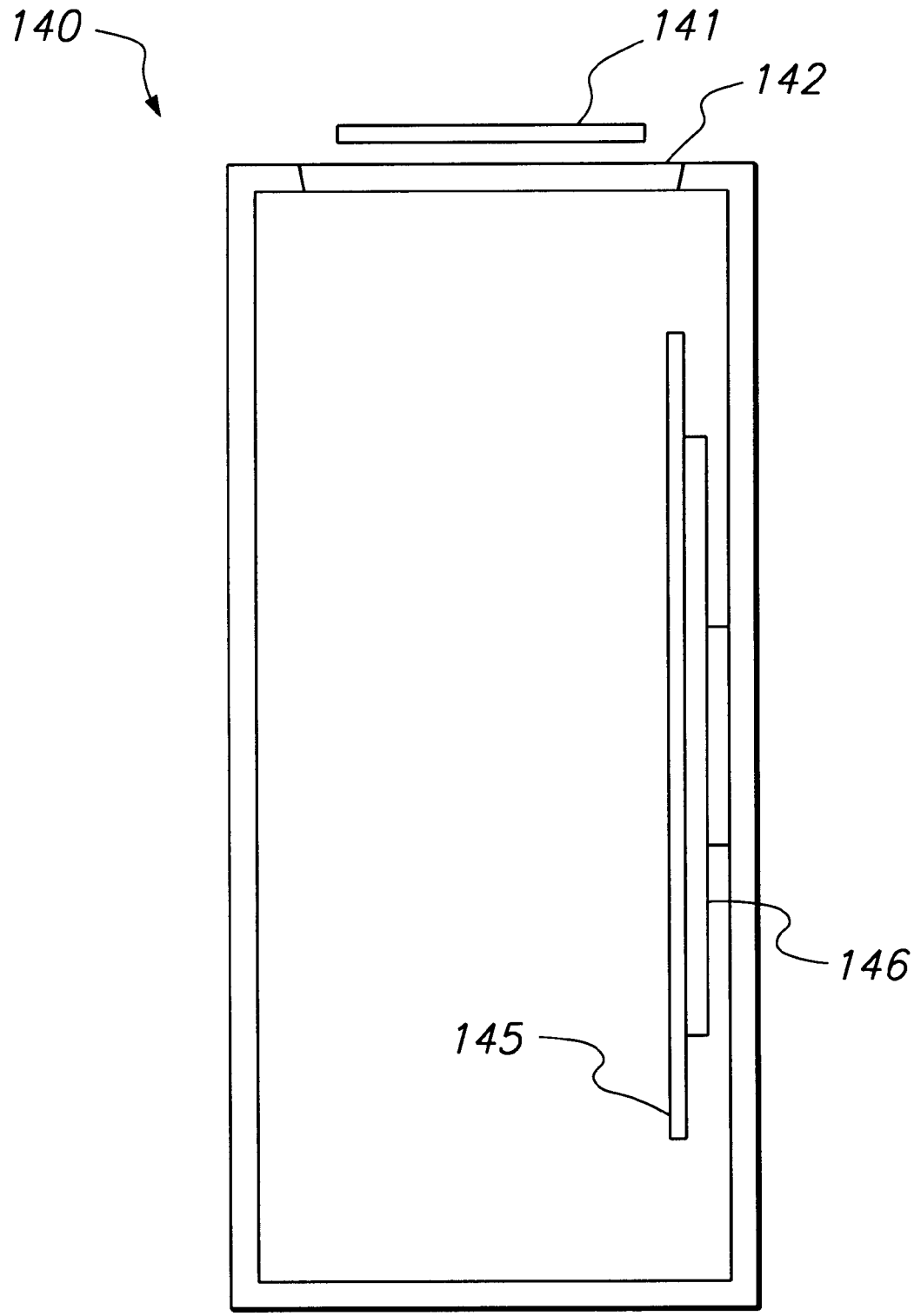

As best seen in FIG. 3B, the RF antennas 31 and 32 excite helicon plasma waves in the ionized gas of the linear source chamber 26, magnets 33, 34, 43 and 44 are used to propagate the helicon waves from the linear source chamber 26 into the vacuum chamber 27. Helicon waves propagate along magnetic field lines. The magnets 33, 34, 43 and 44 are arranged to produce a magnetic field with substantially parallel magnetic field lines within the linear source chamber 26 and the vacuum chamber 27. The magnetic field lines of the magnetic field produced by the magnets 33, 34, 43 and 44 extend from the linear source chamber 26 into the vacuum chamber 27. Helicon waves generated by the RF antennas 31 and 32 propagate along the magnetic field lines in the linear source chamber 26 into the vacuum chamber 27. The helicon plasma waves propagating into the vacuum chamber 27 contact the substrate 29 located on the workpiece holder 30 in the vacuum chamber 27. In an alternate embodiment of the present invention shown in FIGS. 3C and 3D, and 3E a substrate holder 120 holds a substrate 29 such that helicon plasma waves propagate parallel to the surface of the substrate 29. As shown in FIG. 3C, the plasma processing device 25 includes a linear source chamber 26, a vacuum chamber 27, a substrate 29, an RF antenna 31, and an RF generator 38 and an RF matching network 35, the functions of which are described earlier in connection with FIGS. 3A and 3B. As shown in FIG. 3D, the plasma processing device 25 includes a linear source chamber 26, a vacuum chamber 27, an opening 28 between the source chamber 26 and vacuum chamber 27, a substrate 29 supported on a substrate support 120, a pair of RF antennas 31 and 32 located on either side of the source chamber 26, an RF generator 38 and an RF matching network 35, a top wall 37 and a bottom wall 36 of the source chamber 26, and magnets 33, 34, 43 and 44, the functions of which are described earlier in connection with FIGS. 3A and 3B. FIG. 3E shows a plasma processing device 140 with an RF antenna 141 located outside the device adjacent to a dielectric window 142, a substrate 145 and a workpiece holder 146 on which the substrate 145 is located.

Figure 4A:
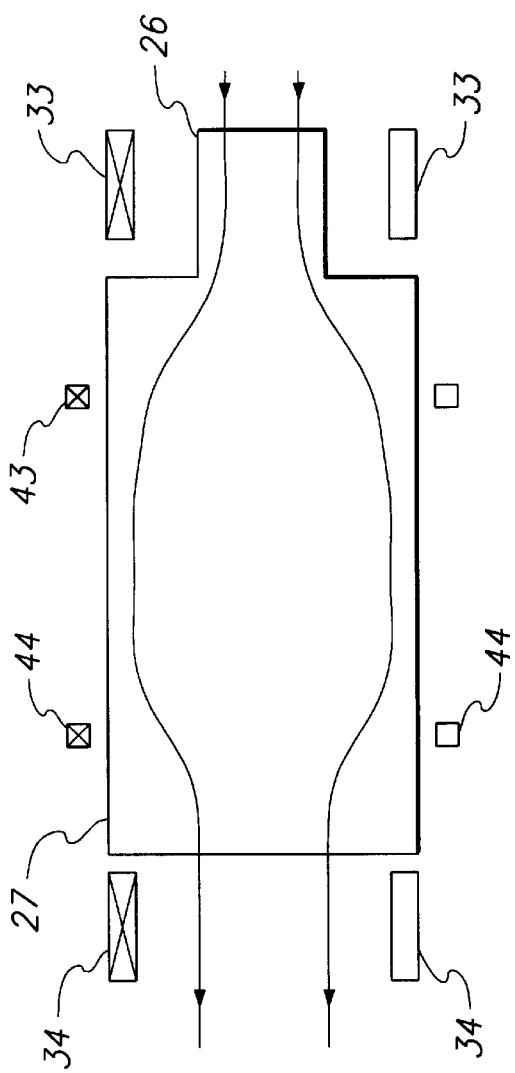
FIG. 4A shows a cross sectional end view of a linear source chamber and the magnetic field generated by the magnets according to one embodiment of the present invention.
Figure 4B:
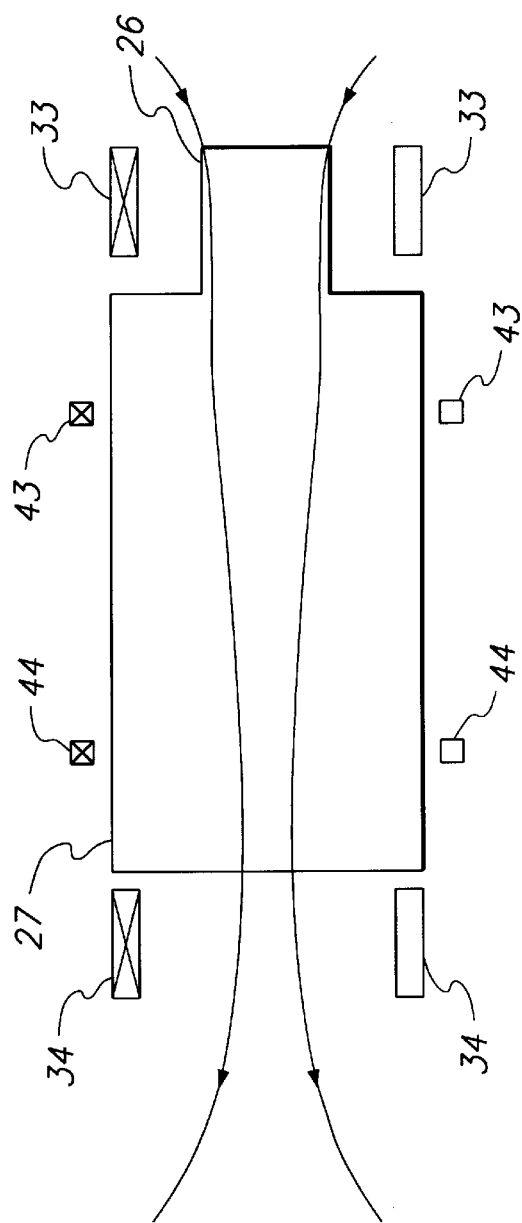
FIG. 4B shows a cross sectional end view of a linear source chamber and the magnetic field generated by the magnets according to one embodiment of the present invention.

FIGS. 4A and 4B show the placement of the magnets 33, 34, 43 and 44 and the magnetic field lines generated by these magnets in the source chamber 27. The magnets 33 and 34 are constructed to produce a static magnetic field with parallel field lines extending from the linear source chamber 26 into the vacuum chamber 27. Several variations of field geometry were found to work in producing plasma and propagating helicon plasma waves into the vacuum chamber 27. As shown in FIGS. 4A and 4B, the "magnetic mirror" geometry of FIG. 4A and the "magnetic beach" geometry of FIG. 4B both produce substantially parallel magnetic field lines within the source chamber 26 which extend from the source chamber 26 into the vacuum chamber 27. The cross marks in the magnets 33, 34, 43 and 44 indicate that current flows into the plane of the page. All of the magnets 33, 34, 43 and 44 are powered with a DC power source that enables each coil to be powered at a separate power level. The beach arrangement in FIG. 4B was shown to produce optimum densities at low pressures, e.g., 3 to 7 mTorr, while the magnetic mirror arrangement was shown to produce optimal densities at higher pressures, e.g., $\geq 20$ mTorr.

Figure 5:
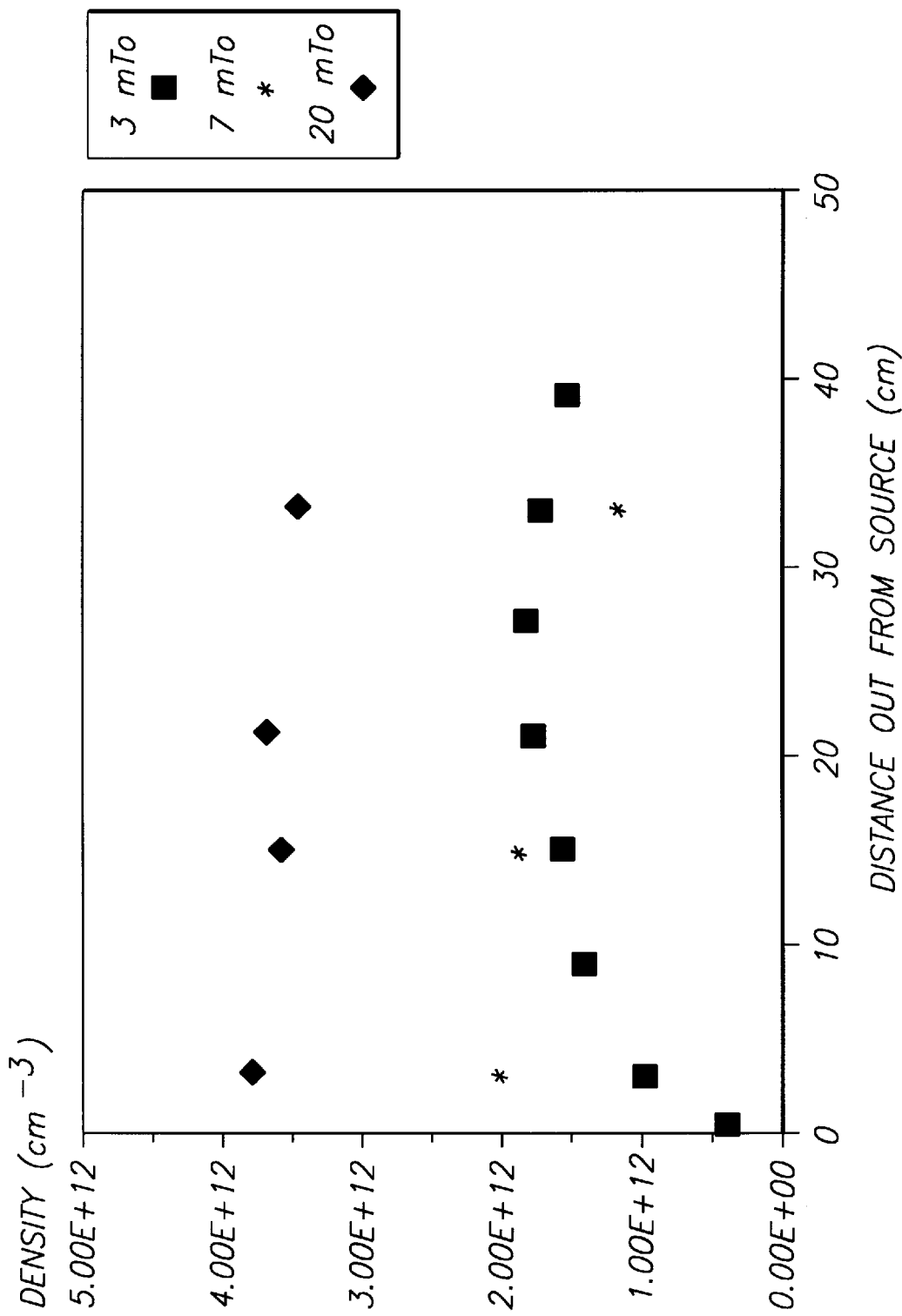
FIG. 5 is a graph of density versus position for different pressures using different magnetic fields in accordance with the present invention.

Measurements of density versus distance out of the source chamber have shown no decrease in plasma density at the pressures of 7 and 20 mTorr and an increase in density away from the source chamber at a pressure of 3 mTorr, as is shown in FIG. 5 where plasma density versus distance from the source chamber is plotted. Measurements in FIG. 5 were taken with the source and vacuum chambers filled with argon and 2000 Watts of power used in the RF antennas 31 and 32. An essential feature of both the "magnetic mirror" and "magnetic beach" field geometries is that neither geometry has a zero or "cusp" in the magnetic field at the center of the vacuum chamber 27, as shown in FIG. 4C.

Each of the field geometries shown in FIGS. 4A–4C may be desirable depending on application requirements. The cusp field geometry shown in FIG. 4C is obtained by having the magnets 33 and 43 powered by oppositely directed current from the magnets 34 and 44. By removing the cusp from the field geometry, a substantial improvement in the propagation of helicon plasma waves into the vacuum chamber 27 from the source chamber 26 is realized. The current in the shaping magnets 43 and 44 can be varied to change between the magnetic mirror and magnetic beach field geometries. Additionally, the current in all of the magnets 33, 34, 43 and 44 can be varied to change both field strength and field geometry within the source chamber and vacuum chamber to allow the most efficient formation and propagation of helicon waves. FIGS. 4D and 4E show a plot of the magnetic field strength as a function of distance from the source chamber 26 into the vacuum chamber 27. FIG. 4D shows a plot of field strength for the "magnetic mirror" field geometry and FIG. 4E shows a plot of field strength for the "magnetic beach" field geometry. When the current in the four magnets 33, 34, 43 and 44 is equal and in the same direction the four magnets create a magnetic field within the source chamber 26 and vacuum chamber 27 much like the magnetic field within a solenoid with parallel field lines extending from the source chamber 26 to the vacuum chamber 27.

To obtain the magnetic field geometries shown in FIGS. 4A and 4B the magnets 33, 34, 43 and 44 are constructed from copper coils in a flexible solenoidal shape. The magnets 33 and 34 each contain 340 turns of number 8 square cross section layers with 17 turns per layer and a height of 20 layers and have a "racetrack" shape of a rounded rectangle, i.e., each of the magnets has the shape of a rectangle with rounded corners. The inner dimensions of the rounded rectangular shape of the magnet are 126.3 cm by 22.34 cm. The magnets 33 and 34 produce a magnetic field of 212 Gauss perpendicular to the plane of the magnet at a current of 20 Amperes. The magnet 33 is located in a position to surround the outside of the linear source chamber 26 and the magnet 34 is located at the back wall of the vacuum chamber 27. The "shaping" magnets 43 and 44 are constructed with the same number of turns as the magnets 33 and 34 and are placed lengthwise around the vacuum chamber to enhance the solenoidal behavior of the magnetic field within the source chamber 26 and vacuum chamber 27. The magnets 43 and 44 are placed to surround the vacuum chamber 27 such that the space separating the magnets 43 and 44 is roughly equal to the space separating magnet 43 from magnet 33 and magnet 44 from magnet 34. The magnetic field from one of the magnets 43 or 44 produces a magnetic field of 52.9 Gauss perpendicular to the plane of the magnet at 10 Amperes.

While the above embodiment shown in FIGS. 4A and 4B used four separate solenoidal magnets 33, 34, 43 and 44 other configurations of magnets including permanent magnets could be used. As discussed above the essential characteristics needed for the formation and propagation of helicon plasma waves are substantially parallel magnetic field lines which extend from the source chamber into the vacuum chamber. Any type of magnet which produces substantially parallel magnetic field lines which extend from the source chamber into the vacuum chamber at the required field strength could be used in place of the magnets 33, 34, 43 and 44 which were used due to their ease of construction and low cost with the resources available.

The RF antennas 31 and 32 are controlled by an RF matching network 35. An RF generator 38 provides the power to the RF antennas 31 and 32. To optimize the efficiency of controlling the RF antennas 31 and 32, the RF matching network 35 should be placed as close as possible to the RF antennas 31 and 32 to minimize the energy loss from the transmission lines between the RF matching network and the RF antennas. The RF network 35 can be a standard RF matching network and power can be provided by a standard RF power generator.

The operation of the plasma processing device 25 shown in FIGS. 3A and 3B is as follows. The linear source chamber 26 and vacuum chamber 27 contain a gas, such as argon or $CF_4$, at a pressure between 0.5 and 100 mTorr. To produce plasma in the linear source chamber 26 the RF antennas 31 and 32 are used to excite helicon waves in the gas of the linear source chamber. The energy from the RF antennas 31 and 32 is coupled to the plasma in the linear source chamber 26. The RF antennas 31 and 32 were operated at a frequency of 13.56 MHz. While 13.56 MHz was used there is nothing special about this frequency and any RF frequency could be used to excite helicon plasma waves. Magnets 33 and 34 placed outside the linear source chamber 26 and vacuum chamber 27 produce a magnetic field having magnetic field lines extending from the linear source chamber 26 to the vacuum chamber 27. The creation of a helicon wave occurs by a capacitive discharge first building up the charge density of the gas in the linear source chamber 26. As the charge density builds and the magnetic field penetrates further into the plasma an inductively coupled plasma is created. At a certain charge density that relates to the magnetic field strength and the size of the opening 28 between the linear source chamber 26 and vacuum chamber 27, helicon wave propagation and coupling of the electromagnetic energy from the RF antenna occurs. The source length of a source chamber can be defined as the distance from the opening 28 to the end of the walls 36,37. Helicon plasma waves, which propagate parallel to magnetic field lines, propagate from the linear source chamber 26 into the vacuum chamber 27 and couple power into the plasma outside the linear source chamber 26.

While the embodiment shown in FIGS. 3A and 3B used a source chamber with a length of 900 mm, a width of 90 mm and a depth of 90 mm, other embodiments could utilize a non-circular source chamber with different dimensions. By using a source chamber with an elongated linear geometry the source chamber can be scaled to a larger process area simply by lengthening the linear source chamber. By doubling the length of the linear source chamber 26, the process area is doubled while only doubling the volume of the source chamber. As the energy needed to create a plasma within a source chamber is proportional to the volume of the source chamber, a doubling of the process area by an increase in length of a linear source chamber requires only a doubling of the energy needed to create a plasma within the linear source chamber. Thus, for a source chamber with a linear geometry, the energy required to create a plasma scales with the volume of the linear source chamber. Additionally, both the width and depth of the linear source chamber can be varied as long as the width and depth fit the dispersion relation allowing helicon wave propagation. The size of the slot can be varied in relation to the linear source chamber to change the density and pressure of the helicon plasma waves propagating from the source chamber.

Additionally, the use of the RF antennas, 31 and 32 in FIGS. 3A and 3B, can be placed along any wall of a source chamber. Alternate embodiments of the linear source chamber shown in FIGS. 3A and 3B could utilize one or more RF antennas located at any of the walls of the source chamber. The essential criteria for placement of an antenna is that it be capable of coupling the energy from the RF antenna into the plasma of the source chamber to create helicon waves in the source chamber. The use of a dielectric on the wall the antenna is located allows the coupling of the energy from the RF antenna into the source chamber. Walls of the source chamber not adjacent to an RF antenna, as stated above, can be made from either a dielectric or metallic material.

An alternate embodiment of the present invention is shown in FIGS. 3C and 3D where the substrate 29 is supported by a workpiece holder 120 (see FIG. 3D) such that helicon plasma waves propagating from the source chamber 26 propagate along the surface of the substrate 29. In such an embodiment the magnets 34 and 44 can be removed while allowing propagation of the helicon plasma waves across the surface of the substrate 29 and providing uniform processing, as seen in FIG. 3D.

While the above embodiments of the present invention utilized a separate source chamber to create a plasma and propagate helicon plasma waves along magnetic field lines into a vacuum chamber, other embodiments could use a dielectric wall in the vacuum chamber instead of a separate source chamber. As shown in FIG. 3E, a plasma processing device 140 has an RF antenna 141 located outside the plasma processing device adjacent to a dielectric "window" 142 in the side wall of the plasma processing device 140. RF energy from the RF antenna 141 is coupled through the dielectric window 142 into the plasma within the plasma processing device to create helicon waves. A pair of magnets (not shown) produce magnetic field lines extending from the region within the plasma processing device adjacent to the dielectric window 142 into the plasma processing device. Helicon waves propagating along the magnetic field lines propagate toward substrate 145 located on a workpiece holder 146. As discussed above, different workpiece holders can be used to allow helicon waves to propagate either perpendicular to, or parallel to, the surface of the substrate 145. As the plasma processing device 140 is a chamber in the shape of a long rectangular box, the dispersion relation, as discussed above, allows the propagation of helicon waves. However, other shapes can be used so long as the dispersion relation allows the propagation of helicon waves. The embodiment shown in FIG. 3E could also omit the magnets used for creating the magnetic field within the plasma processing device 140. When a magnetic field is desired, any type of magnet can be used which produces magnetic field lines which extend from the dielectric window 142 toward the opposite end of the plasma processing device 140 from the dielectric window 142.

Figure 6:
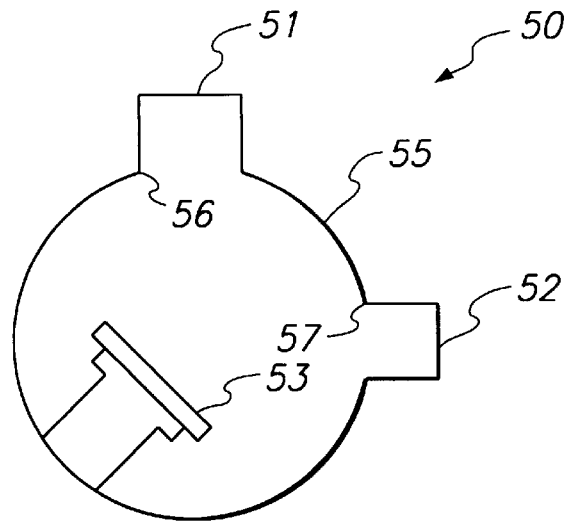
FIG. 6 shows a cross sectional end view of a vacuum chamber with two linear source chambers in accordance with the present invention.
Figure 7A:
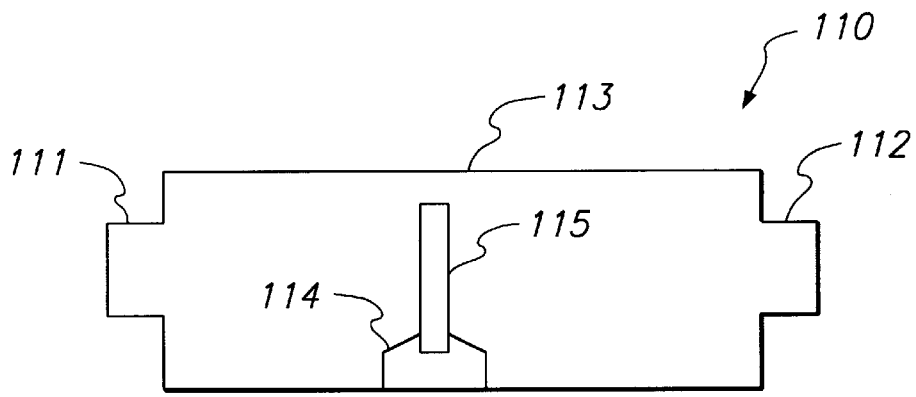
FIG. 7A shows a cross sectional end view of a vacuum chamber with two linear source chambers in a diametrically opposing configuration in accordance with the present invention and FIG. 7B shows a similar arrangement wherein a pair of substrate holders hold substrates such that helicon plasma waves from two source chambers propagate parallel to and along the surface of each substrate.
Figure 7B:
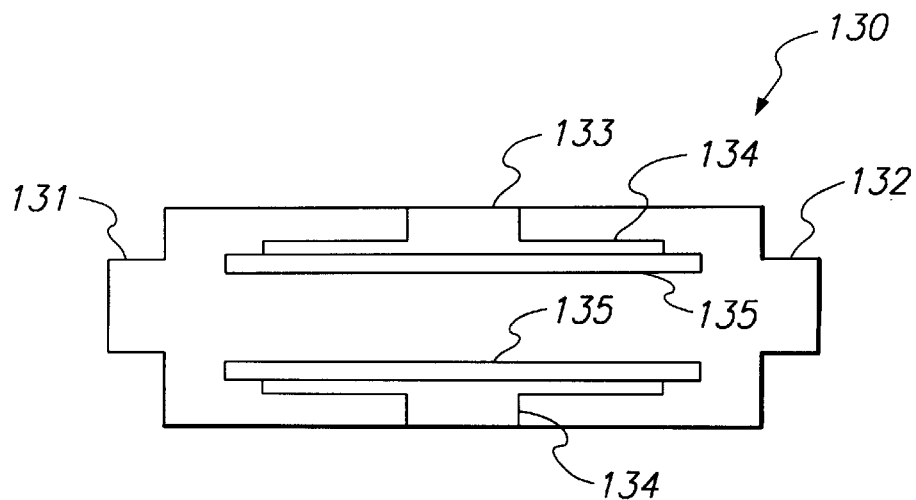

The nature of the helicon waves propagating from an extended linear geometry allows two source chambers to propagate helicon plasma waves onto a substrate without having the helicon waves from each source chamber significantly interfere with each other. As shown in FIG. 6, two extended linear source chambers 51 and 52 are connected to a vacuum chamber 55. The linear source chambers 51 and 52 have their long axes parallel and the slot opening 56,57 from each chamber is arranged to propagate plasma waves into the vacuum chamber 55 such that the helicon plasma waves from each chamber propagate in a direction that is not parallel to helicon plasma waves from the other linear source chamber 26. The chambers 51 and 52 are said to be "opposing" each other since they do not propagate helicon plasma waves parallel to each other. As arranged in the plasma processing device 50, the helicon plasma waves from the linear source chambers 51 and 52 converge on the substrate 53. In another embodiment of the present invention, as shown in FIG. 7A, a plasma processing device 110 has two source chambers 111 and 112 diametrically opposing each other such that helicon plasma waves from each source chamber propagate directly toward the other chamber and into the vacuum chamber 113. A substrate 115 in a workpiece holder 114 can be processed on both sides by the two diametrically opposed source chambers 111 and 112. In another embodiment of the present invention shown in FIG. 7B, a plasma processing device 130 has a pair of diametrically opposed source chambers 131 and 132 attached to a vacuum chamber 133. A pair of substrate holders 134 hold substrates 135 such that helicon plasma waves from the source chambers 131 and 132 propagate parallel to and along the surface of each substrate 135, thus allowing two substrates to be processed simultaneously. As can be seen from the embodiments shown in FIGS. 7A and 7B, the present invention can process a substrate which is positioned in any one of many positions with respect to the propagation of helicon waves. Any number of different substrate workpiece holders can be utilized with the present invention and the examples shown above area to be considered illustrative and not restrictive.

While the embodiment shown in FIG. 6 uses two linear source chambers other embodiments could use three or more linear source chambers. Additionally, other embodiments could combine linear source chambers with source chambers of other geometries such as one or more cylindrical source chambers to process a substrate.

The above embodiments utilized a non-cylindrical source chamber in the shape of an extended rectangular box with a long rectangular slot between the linear source chamber and the vacuum chamber. Other embodiments of the present invention could use other non-cylindrical shapes for a source chamber such as square or rectangular. Additionally, the size and shape of the slot between the source chamber and the vacuum chamber can be varied to alter the characteristics of formation and propagation of helicon plasma waves. The different shapes for the source chamber can be combined with different slot sizes and shapes to produce a helicon plasma processing device capable of processing the desired area of one or more substrates. Any size or shape source chamber can be utilized, including different size and shape slots, so long as the dispersion relation for that source chamber geometry allows the propagation of helicon waves.

The processing of a substrate, such as a silicon wafer or a plate glass, can be accomplished in several ways with the present invention. As the present invention allows the use of non-cylindrical source chambers, the present invention is adaptable to different methods of processing substrates with a plasma. More particularly, the present invention can be used to sweep plasma across the surface of a substrate, thereby allowing the processing of significantly larger substrate areas more efficiently than when processing in a stationary configuration. A single linear source chamber can be used in a stationary position while a substrate is moved through the plasma propagating from the source chamber. Additionally, the substrate can be fixed and the source chamber swept across the substrate to process the substrate with the helicon plasma waves propagating from the source chamber. In another possible embodiment, both the substrate and the source chamber can be stationary during the processing of the substrate with helicon waves from the source chamber. The embodiment shown in FIGS. 3A and 3B using a linear source region is particularly adaptable to processing flat panel displays. The length of the linear source region is chosen to provide a uniform line of plasma equal to or greater than the width of the plate glass to be coated for use in the flat panel display. For instance, the plate glass can be placed on a movable workpiece holder and passed through the plasma of the linear source chamber to coat the plate glass. Due to the scalability of the linear source chamber design, larger pieces of plate glass can be coated by increasing the length of the source chamber. In another embodiment of the present invention both the source chamber and the substrate are in a fixed position during the processing of the substrate. The present invention is applicable to deposition and etching of substrates, such as the etching of semiconductor wafers in the production of integrated circuit chips.

Figure 8:
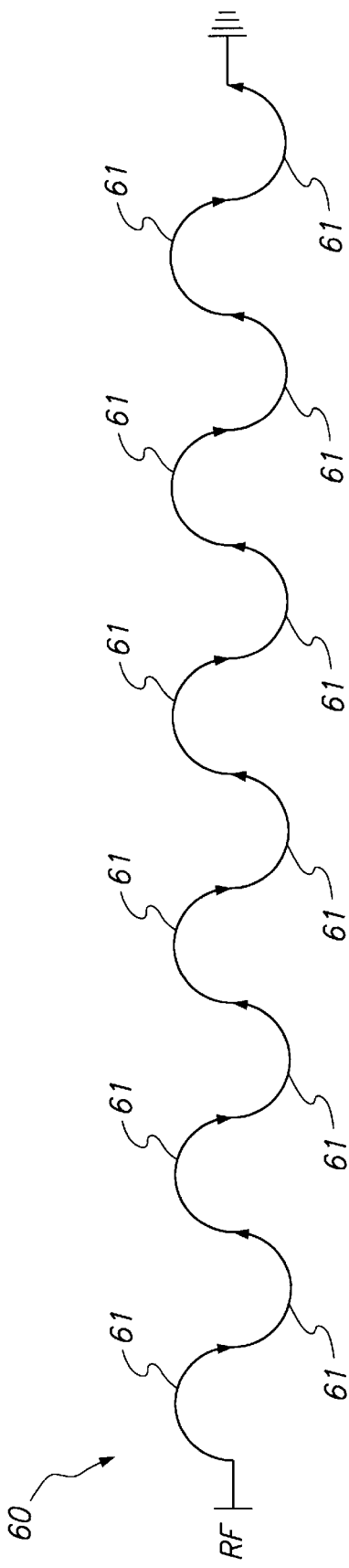
FIG. 8 shows a serpentine RF antenna in accordance with the present invention.

Prior art RF antennas used in exciting helicon plasma waves in the source chamber were specifically designed to efficiently produce helicon plasma waves in a cylindrical geometry chamber with a typical diameter of 10–20 cm. As such, they are not applicable to producing helicon plasma waves in source chambers with different geometries. FIG. 8 shows an RF antenna 60 with a serpentine configuration to be used with a source chamber of a plasma processing device. More particularly, the serpentine antenna configuration has been shown to produce uniform helicon plasma waves along the length of a source chamber with an extended linear geometry, as shown in FIGS. 2, 3A and 3B. The alternating semicircular arcs, or half loops, 61 of antenna 60 are formed to produce alternating magnetic fields which set up "push-pull regions". The magnetic field produced by a loop of an RF antenna is determined by the right hand rule and is perpendicular to the plane of the loop. By using alternating semicircular half loops 61 the present invention is able to produce regions of alternating magnetic field along the length of the serpentine antenna 60. The alternating magnetic field of the serpentine antenna 60, when placed adjacent to the walls of the source chamber, sets up alternating magnetic fields within the source chamber which in turn set up regions that "push and pull" the ionized gas within the source chamber. These "push/pull regions" within the source chamber in turn excite the ionized gas into helicon plasma waves. The use of "push/pull" regions with the serpentine antenna 60 is the most efficient means of producing helicon waves within the source chamber.

The serpentine antenna 60 is particularly adaptable to scaling the source chamber due to the alternating semicircular loops 61 which make up the serpentine antenna 60. To produce a serpentine antenna 60 for a longer linear source chamber additional semicircular loops are added to the antenna design to achieve a length of the antenna roughly equal to the length of the source chamber. For a linear source chamber as shown in FIGS. 3A and 3B which has dimensions of 900 mm long by 90 mm wide by 90 mm deep, the length of the serpentine antenna 60, shown in FIG. 8, from one end of the antenna to the other is 72 cm. To create 4 push/pull regions, the serpentine antenna has 8 semicircular loops. The serpentine antenna is formed from a 1 cm wide copper strap formed into 4 cm radius loops. Both the size of the semicircular loops and the number of semicircular loops in the antenna 60 are chosen to couple to a mode within the source chamber to allow helicon waves to form within the source chamber. By correlating the length of the source chamber and the serpentine antenna, helicon plasma waves are created along the entire length of the linear source chamber. By keeping the semicircular loops of the serpentine antenna equal in both length and shape, the serpentine antenna is able to uniformly create plasma along the length of the linear source chamber. Helicon plasma waves, which are noted for producing a high density low pressure plasma, can then be uniformly generated along the length of the linear source chamber. As stated above, a uniform high density, low pressure plasma is ideal for processing substrates.

Figure 9:
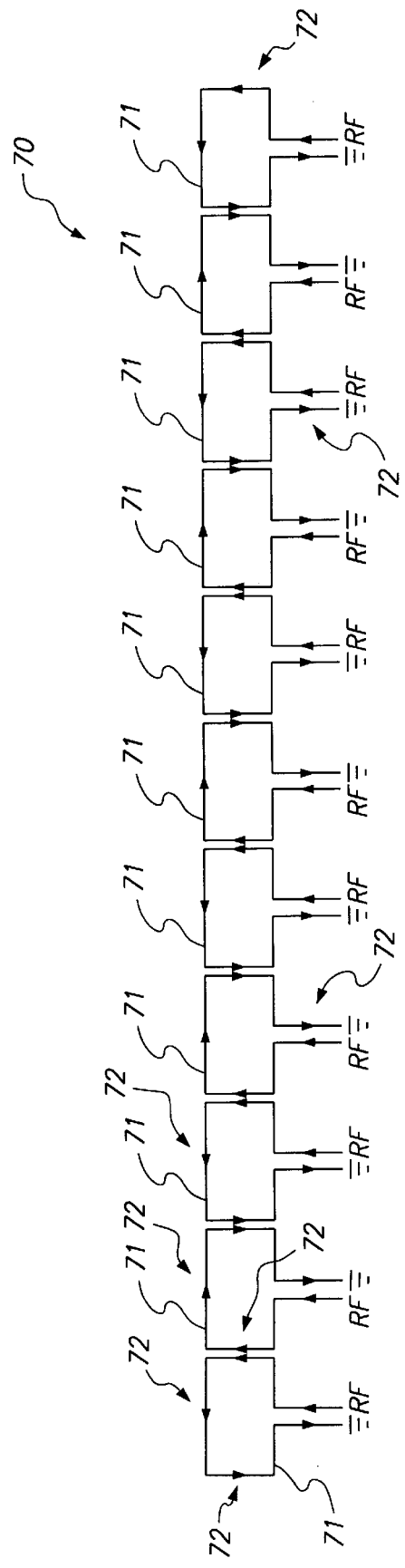
FIG. 9 shows a multiple loop RF antenna in accordance with the present invention.

While the linear source chamber described above uses a serpentine antenna 60 other antenna configurations could be used which, by inducing push/pull regions within the linear source chamber, are able to create helicon plasma waves. FIG. 9 shows a looped RF antenna 70 which is used in conjunction with a linear source chamber to produce helicon plasma waves along the entire length of a linear source chamber. The looped antenna 70 has discrete loops 71 along its length which, during operation on a dielectric wall of a source chamber, produce push/pull regions within the source chamber, thus inducing helicon wave formation within the source chamber. As current flows through the looped RF antenna 70, as indicated by the current indication arrows 72, each loop acts as a coil of wire creating a magnetic field within the source chamber. In this embodiment, each of the loops 71 is powered in parallel by an RF generator, wherein one end of each loop 71 is connected to the RF generator and the other end is connected to ground. In another embodiment of the present invention, the looped antenna 70 could be formed from one conductive strap or wire formed into many loops and connected to an RF generator. In the case where the loops 71 are powered in series, not shown, the looped RF antenna has performance characteristics similar to the serpentine antenna 60 described above. By powering the looped antenna 70 in parallel, the loops 71 have current flowing around each respective loop in the opposite direction from the neighboring loops on either side. This alternating of current flow between neighboring loops produces magnetic fields of alternating orientation within the source chamber, thus creating push/pull regions within the source chamber. The size of the loops 71 and the number of loops 71 in the looped antenna 70 is chosen to couple to a mode within the source chamber allowing helicon waves to form within the source chamber. As few as one loop or as many as several dozen loops could be used depending on the size of the source chamber and the mode of the source chamber that is to be utilized. To produce a uniform plasma over the length of the source chamber, the loops 71 are preferably all equal in both size and shape. As with the serpentine antenna 60 above, the looped antenna 70 can be used in pairs with one antenna on either side of the linear source chamber or a single looped antenna can be used on one side of the source chamber, albeit not producing helicon wave plasma as efficiently as when used in conjunction with a second antenna on the opposite side of the source chamber.

FIGS. 10A–10F show locations of RF input to antennas, arrows indicating direction of current travel in the antennas and variations of RF antenna configurations which can be utilized to excite a plasma within a source chamber to create helicon plasma waves. These variations include a large loop antenna 100, a small loop antenna 101, small looped antennas in parallel with codirectional currents 102, small looped antennas in parallel with antidirectional currents 103, small looped antennas in series 104 and another small looped antenna in series 105.

Of the 6 different antenna configurations shown in FIGS. 10A–10F, there are considerable performance differences between the antennas when used with a rectangular source chamber geometry. The large loop antenna 100 (FIG. 10A) and the small loop antenna 101 (FIG. 10B), even when used with a second antenna on the opposite side of the source chamber, were not able to excite helicon waves even though they were able to produce a plasma in the gas of the source chamber. The antennas 102 (FIG. 10C) and 103 (FIG. 10D) which were tried next showed markedly different performance characteristics. When the pair of small antenna loops were used together on the same side of the source chamber, with a second pair similarly arranged on the opposing side of the source chamber, not only was there plasma formation but helicon waves were excited in the plasma of the source chamber. The pair of loop antennas 103, similarly shaped and arranged as the antennas 102 but powered in opposite directions, exhibited helicon wave excitation only in the region of the source chamber in greatest proximity to the loops. Additionally, with the antenna 103 the two loops didn't assist each other by inducing greater helicon wave excitation in regions of the source chamber other than those regions in greatest proximity to each of the loops. In the antenna 102 the two loops that make up the antenna created plasma more uniformly along the length of the source chamber and the plasma creation was not limited to the regions of the source chamber in greatest proximity to each of the loops. Helicon wave formation was observed due to the creation of push/pull regions set up by the parallel lines 106 which, in the loop antenna 102, carry current traveling in opposing directions. In the antenna 103, and similarly antennas 100 and 101, there is no close parallel and oppositely directed current to create the push/pull regions so effective at exciting helicon waves. The antenna configurations 104 (FIG. 10E) and 105 (FIG. 10F) built upon the realization that the parallel sections of the antenna with oppositely directed current were creating push/pull regions which excited the plasma within the source chamber into helicon waves. The serpentine antenna 60 shown in FIG. 8, which has produced the best results in the excitation of helicon waves, also uses oppositely directed currents by having the current traveling in opposite directions as the current flows from semicircular loop to semicircular loop, thereby creating push/pull regions within the plasma of the source chamber and exciting helicon waves. As with the serpentine antenna 60 shown in FIG. 8 and the multiple looped antenna 70 powered in parallel, shown in FIG. 9, the size and shape of the antenna must be designed to couple to a mode of the source chamber such the RF energy of the antenna is coupled into the plasma to create push/pull regions within the plasma, thereby exciting helicon waves. In a source chamber with a linear geometry, as shown in FIG. 3A and FIG. 3B, the size and shape of the loops or semicircular arcs needed to couple to a mode of the linear source chamber depend upon the width and depth of the source chamber, and not upon the length of the source chamber. The total power supplied to the RF antenna to excite helicon waves will depend upon pressure in the source chamber, type of gas in the source chamber, volume of the source chamber, and strength of the magnetic field within the source chamber.

While the above antenna designs are for use with a linear source chamber having a dielectric wall, as shown in FIGS. 3A and 3B, where the RF antenna was mounted external to the source region, other embodiments could use RF antennas mounted within the source chamber. In such embodiments, the RF antenna to be used should withstand plasma bombardment. The source chamber in such an embodiment can be made of either metal or dielectric material. If metal is used for the walls of the source chamber closest to the RF antenna significant power loss can be a problem due to eddy currents induced in the metal walls of the source chamber.

Figure 11:
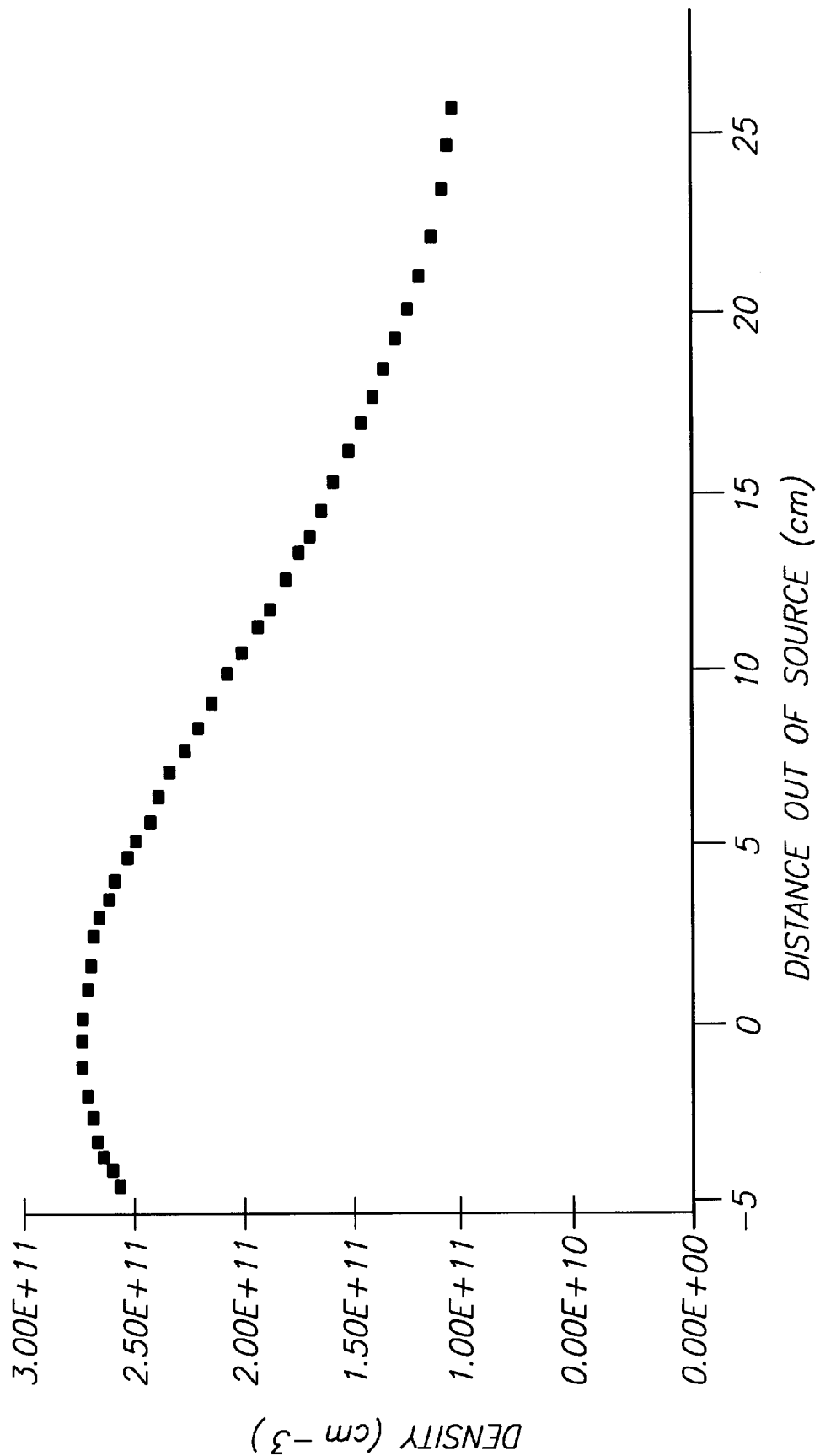
FIG. 11 is a graph of plasma density versus distance from the linear source chamber for a plasma processing device utilizing a pair of serpentine antennas.
Figure 12:
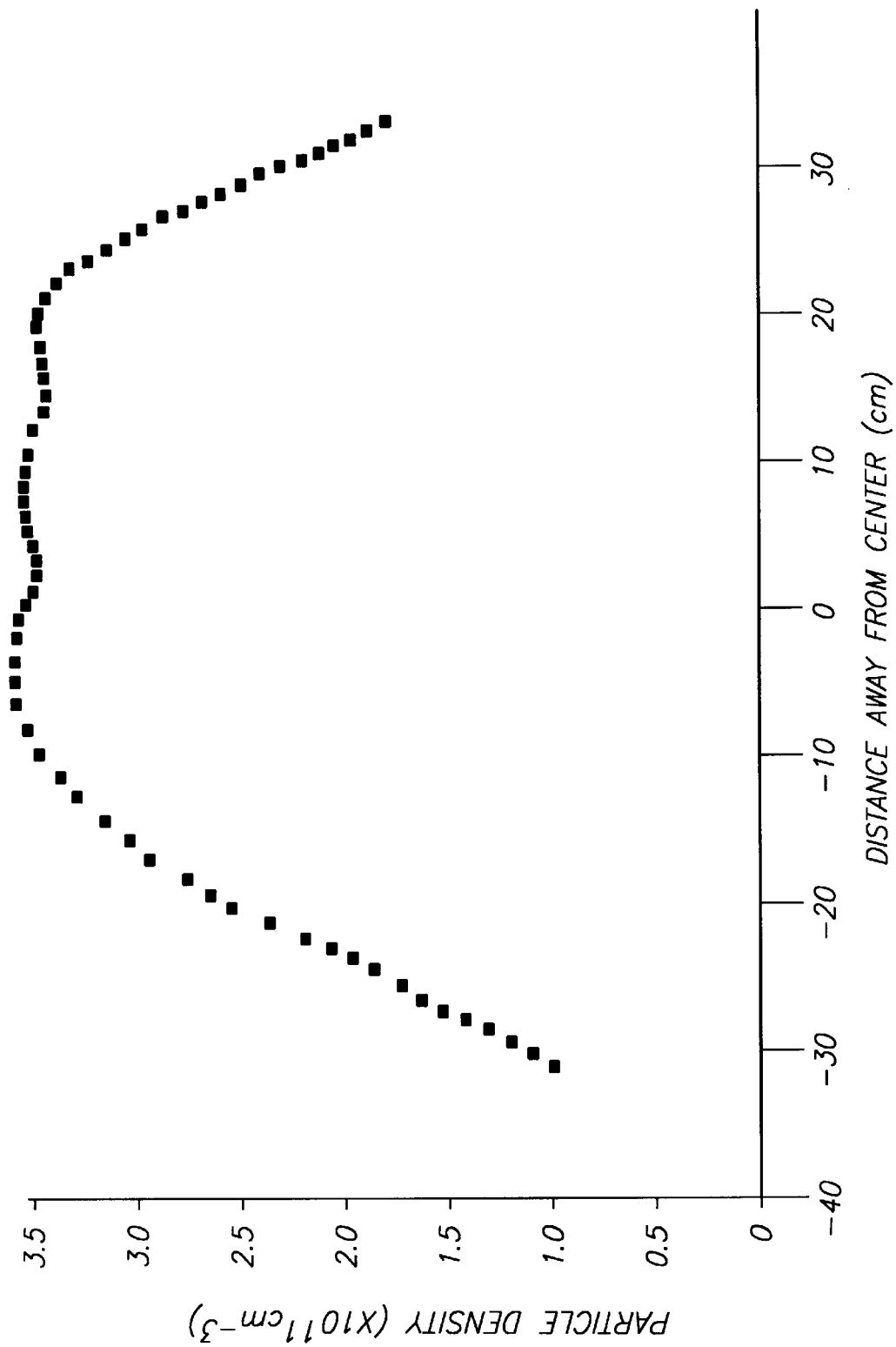
FIG. 12 is a graph of plasma density versus distance from the center of the linear source chamber in accordance with the present invention.
Figure 13:
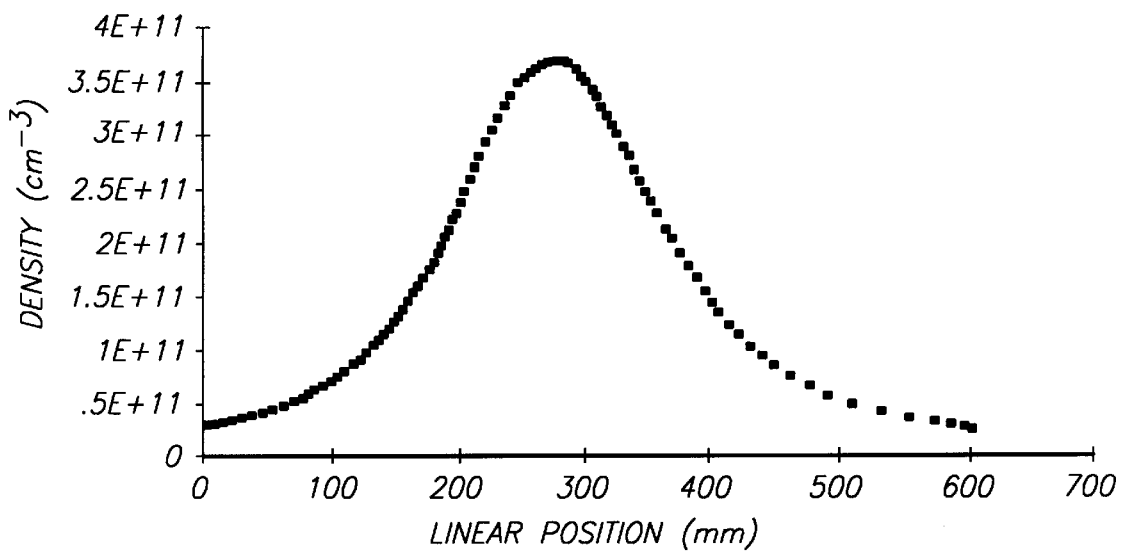
FIG. 13 is a graph of plasma density versus distance from the center of a linear source chamber in a plasma processing device utilizing a pair of looped antennas in accordance with the present invention.
Figure 14:
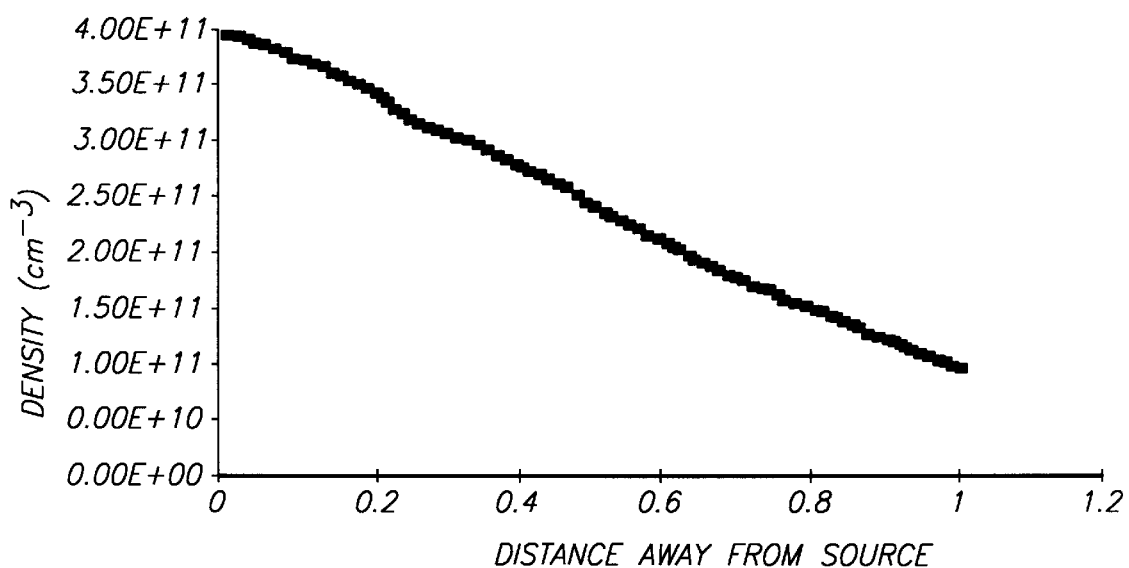
FIG. 14 is a graph of plasma density versus distance from the source chamber in a plasma processing device utilizing a pair of looped antennas in accordance with the present invention.

FIG. 11 shows a plot of plasma density versus position away from the linear source chamber utilizing two serpentine antennas shown in FIG. 8 in the configuration shown in FIGS. 3A and 3B. The plot was taken with a total power of 2000 Watts in the pair of serpentine antennas. The plot in FIG. 12 shows plasma density versus position away from the center of the source chamber, taken 5 cm from the source chamber, along the length of the linear source chamber. FIG. 13 shows a plot of density versus position along the length of the linear source chamber for a pair of small loop antennas. FIG. 13 shows a plot of density versus distance from the source chamber for a pair of small looped antennas. FIGS. 13 and 14 were done at 28 mTorr with a total power of 800 watts in the pair of small loop antennas. As expected, the small antenna pair generates a plasma that is strongly peaked around the center of the linear source chamber where the small loop antenna pair was located. The plots shown in FIGS. 11 and 12 using a pair of serpentine antennas showed significantly broader distribution of plasma along the length of the linear source chamber. The plots in FIGS. 11, 12, 13, and 14 used a different configuration for the magnets than the configuration shown in FIGS. 4A and 4B. While the actual results may differ somewhat between the two configurations of magnets the general principles are the same, i.e., that the serpentine antenna, which coupled to a mode of the source chamber, was able to produce a high density, low pressure plasma along a significant portion of the length of the source chamber. While plasma can be generated by almost any antenna, without necessarily coupling into a mode of the source chamber, at the proper pressure by introducing a perturbation, formation of helicon plasma waves along the source chamber is most effectively and efficiently produced by an antenna coupled to a mode of the source chamber. While a pair of serpentine antennas, one located on either side of the linear source chamber, has shown the best results of producing a high density, low pressure plasma which is uniform along the length of the source chamber, other antenna designs which couple to a mode of the chamber are also capable of producing helicon plasma waves with high density, and low pressure with varying levels of uniformity over the source length. Further discussion of the performance characteristics of the looped antennas and other antenna configurations is contained in U.S. Provisional Patent Application Ser. No. 60/000,714, filed Jun. 29, 1995.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A plasma processor, comprising:
   a source chamber for generating a plasma;
   a vacuum chamber for processing a workpiece, said vacuum chamber connected to the source chamber in a manner allowing said plasma from the source chamber to propagate into the vacuum chamber;
   a wave launching arrangement comprising a serpentine antenna for propagating helicon waves from the source chamber into the vacuum chamber, the serpentine antenna being comprised of a conductor in a series of semicircular arcs alternating in direction; and wherein said source chamber has a non-cylindrical geometry.

2. A plasma processor as in claim 1, wherein said source chamber is in the shape of an elongated rectangular box.

3. A plasma processor as in claim 2, further comprising an elongated slot connecting said source chamber to said vacuum chamber and wherein the elongated slot is parallel to a long axis of the source chamber.

4. A plasma processor as in claim 1, further comprising a slot like opening connecting the source chamber to the vacuum chamber.

5. A plasma processor as in claim 1, wherein the wave launching arrangement further comprises an RF generator, an RF matching network and at least one magnet operatively connected together.

6. A plasma processor as in claim 5, wherein the at least one magnet comprises at least one electromagnetic coil or at least one permanent magnet.

7. A plasma processor as in claim 6, wherein two magnets of said at least one magnet are used in the wave launching arrangement.

8. A plasma processor as in claim 1, further comprising:
a second source chamber for generating a further plasma, said second source chamber connected to the vacuum chamber in a manner allowing said further plasma from the second source chamber to propagate into the vacuum chamber; and
a second wave launching arrangement for propagating further helicon waves from the second source chamber into the vacuum chamber.

9. A plasma processor as in claim 8, wherein said second source chamber has an elongated shape for providing as said further plasma high density low pressure plasma in said vacuum chamber.

10. A plasma processor as in claim 9, wherein longitudinal axes of the first and second source chambers are substantially parallel to each other.

11. A multiple source region plasma processor, comprising:
a plurality of linear source chambers for generating a plasma;
a vacuum chamber for processing a workpiece;
a plurality of wave launching arrangements for propagating respective helicon waves from said corresponding plurality of source chambers into said vacuum chamber; and
a respective elongated slot for connecting each of said plurality of linear source chambers to said vacuum chamber, said plurality of source chambers being arranged such that said respective helicon waves launched by said corresponding wave launching arrangement propagate in a direction not substantially parallel to the waves propagating from the other of said plurality of linear source chambers.

12. A plasma processor, comprising:
a source chamber for generating a plasma;
a vacuum chamber for processing a workpiece, said vacuum chamber connected to the source chamber in a manner allowing said plasma from the source chamber to propagate into the vacuum chamber;
a wave launching arrangement for propagating helicon waves from the source chamber into the vacuum chamber; and
wherein said source chamber has a non-cylindrical geometry, the wave launching arrangement comprises an RF antenna, an RF generator, an RF matching network and at least one magnet operatively connected together, the at least one magnet comprises at least one electromagnetic coil or at least one permanent magnet, and the at least one magnet of the wave launching arrangement produces substantially parallel magnetic field lines extending from the source chamber to the vacuum chamber.

13. A method of processing an area of a surface of a workpiece comprising the steps of:
propagating helicon waves with a serpentine antenna so as to create a rectilinearly extending region of high density low pressure plasma within a vacuum chamber, the serpentine antenna being comprised of a conductor in a series of semicircular arcs alternating in direction; and
sweeping said line of plasma across the surface of said workpiece.

14. A multiple source region plasma processor, comprising:
a plurality of linear source chambers for generating a plasma;
a vacuum chamber for processing a workpiece;
a plurality of wave launching arrangements for propagating respective helicon waves from said corresponding plurality of source chambers into said vacuum chamber, each of the wave launching arrangements comprising a respective serpentine antenna comprised of a corresponding conductor in a series of semicircular arcs alternating in direction; and
a respective elongated slot for connecting each of said plurality of linear source chambers to said vacuum chamber.

15. A serpentine antenna of a wave launching arrangement which propagates helicon waves in a plasma processing device, said serpentine antenna being comprised of a conductor in a series of semicircular arcs alternating in direction.

16. A serpentine antenna as in claim 15, wherein each of said semicircular arcs is in a common plane and wherein the arcs alternate in opposite directions.

* * * * *